(12) United States Patent  (10) Patent No.: US 7,951,631 B2
Jeon et al.  (45) Date of Patent: May 31, 2011

(54) HALFTONE MASK, METHOD OF MANUFACTURING THE SAME, AND METHOD OF MANUFACTURING AN ARRAY SUBSTRATE USING THE SAME

(75) Inventors: Woo-Seok Jeon, Seongnam-si (KR); Jung-In Park, Suwon-si (KR); Hi-Kuk Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 119 days.

(21) Appl. No.: 12/200,525

(22) Filed: Aug. 28, 2008

(65) Prior Publication Data

US 2009/0176325 A1 Jul. 9, 2009

(30) Foreign Application Priority Data

Jan. 3, 2008 (KR) .................... 10-2008-0000642

(51) Int. Cl.
*H01L 21/00* (2006.01)
*G03F 1/00* (2006.01)
(52) U.S. Cl. ............................................. 438/34; 430/5

(58) Field of Classification Search .................. None
See application file for complete search history.

(56) References Cited

U.S. PATENT DOCUMENTS 5,419,988 A * 5/1995 Mohri et al. ................ 430/5
6,440,613 B1 * 8/2002 Doan .......................... 430/5

* cited by examiner

*Primary Examiner* — Andy Huynh
*Assistant Examiner* — Valerie Brown
(74) *Attorney, Agent, or Firm* — F. Chau & Associates, LLC

(57) ABSTRACT

A halftone mask includes a transparent substrate, a light-blocking layer, a first semi-transparent layer and a second semi-transparent layer. The transparent substrate includes a light-blocking area, a light-transmitting area, a first halftone area transmitting first light, and a second halftone area transmitting second light that is less than the first light. The light-blocking layer is formed in the light-blocking area to fully block light from being transmitted. The first and second semi-transparent layers are formed on the transparent substrate. At least one of the first and second semi-transparent layers is formed in the first halftone area, and the first and second semi-transparent layers are overlapped with each other on the second halftone area.

18 Claims, 31 Drawing Sheets

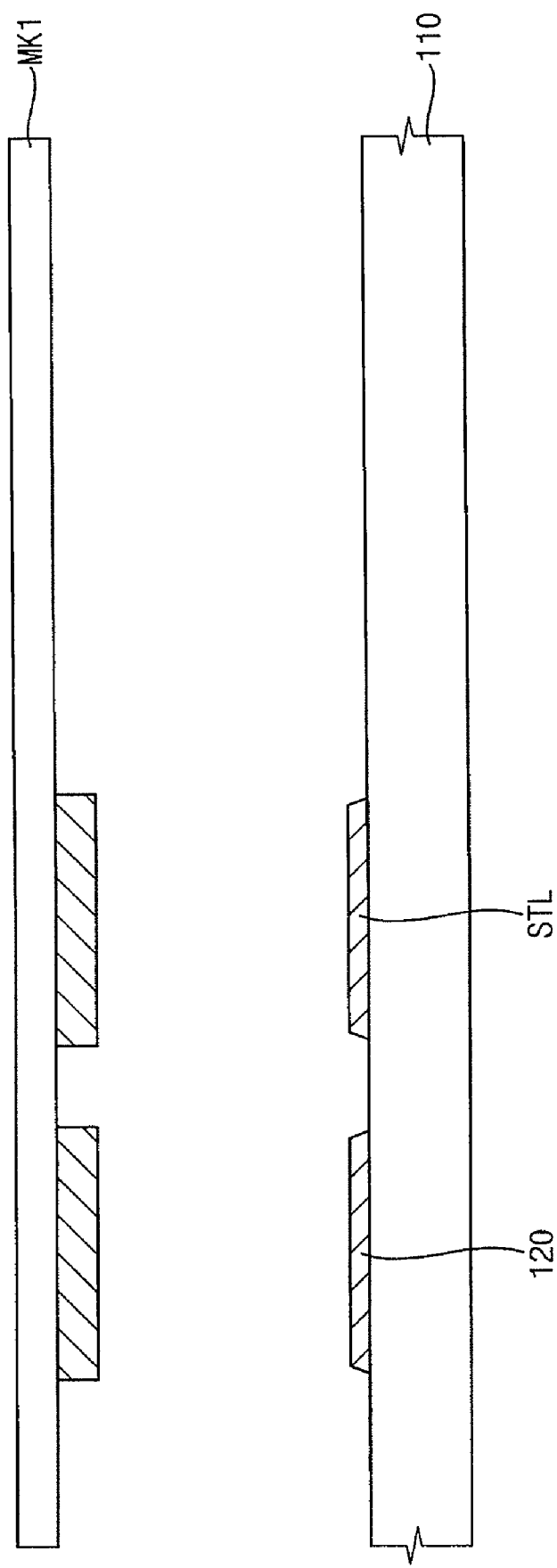

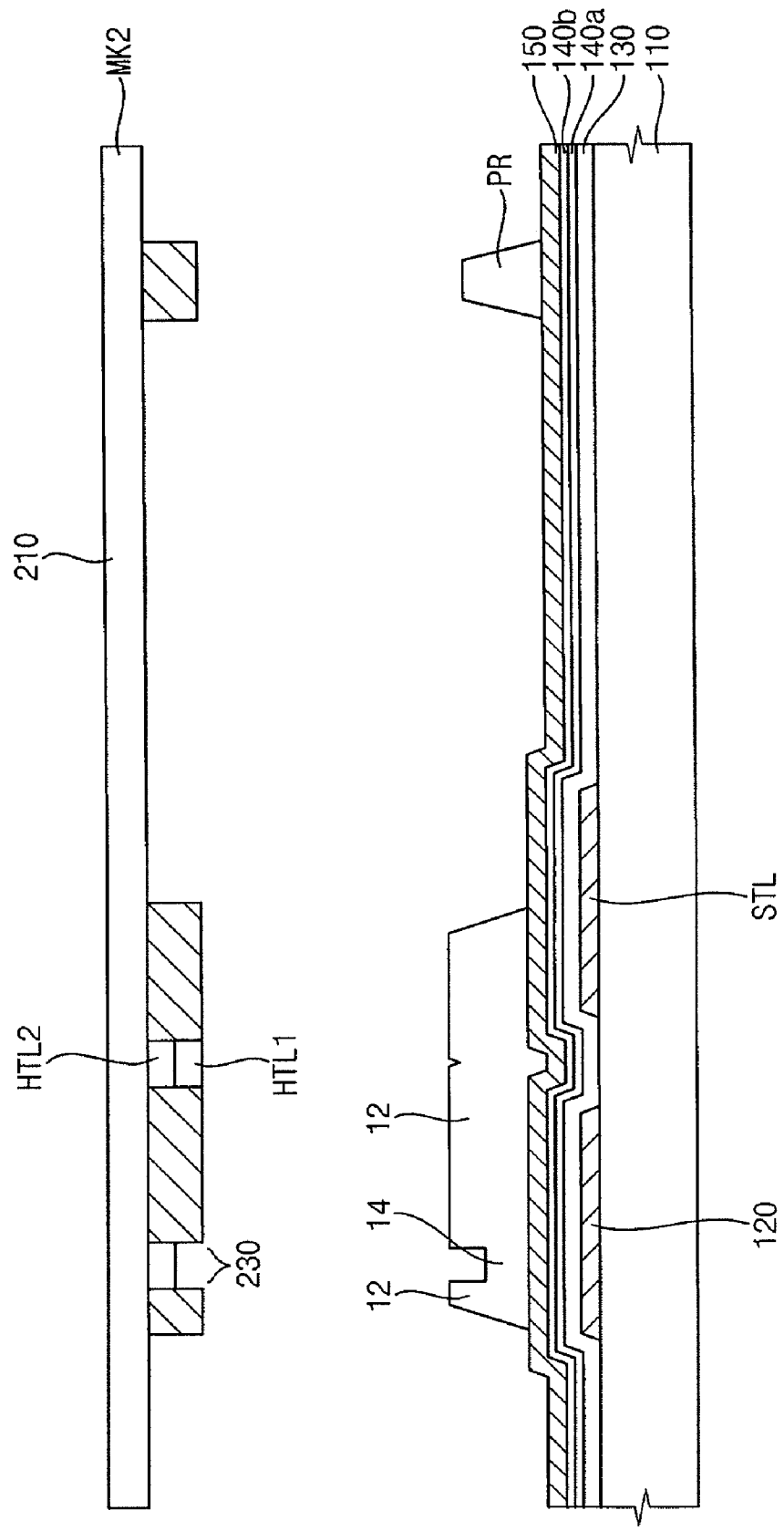

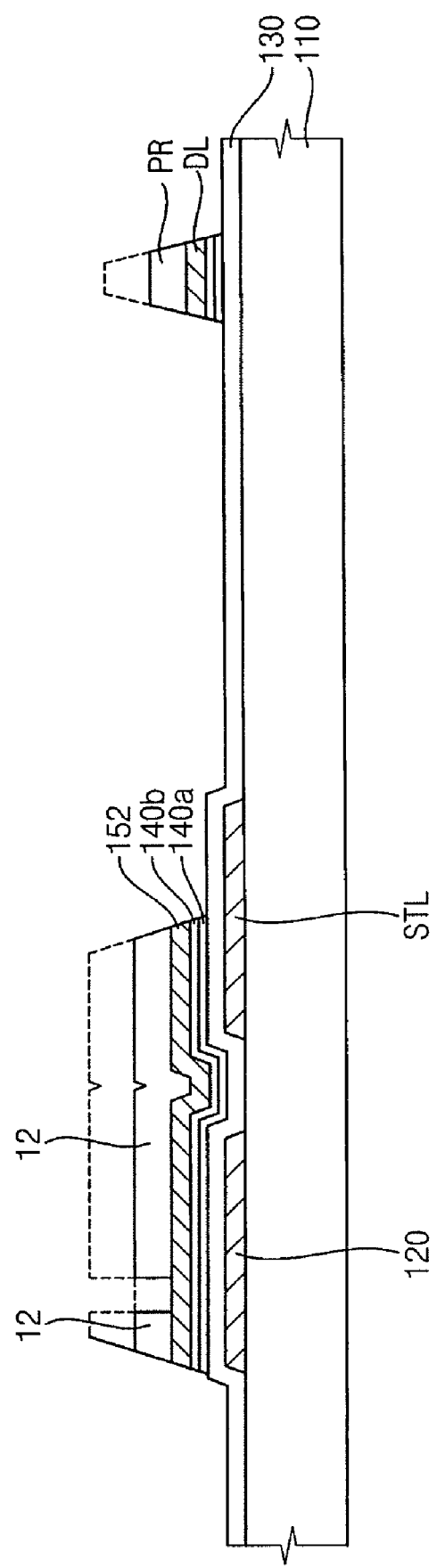

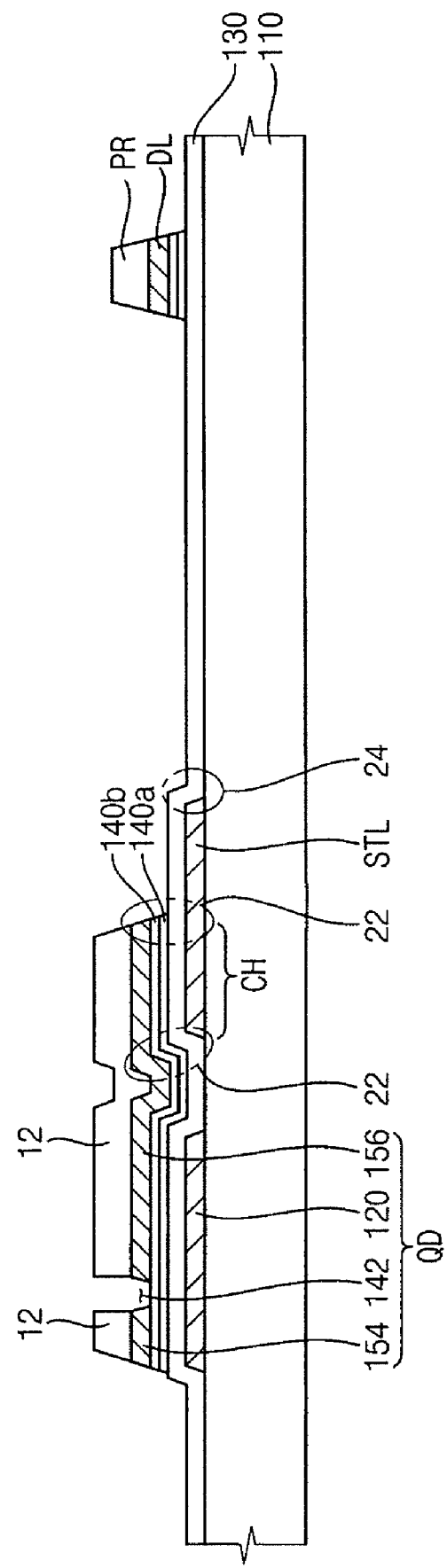

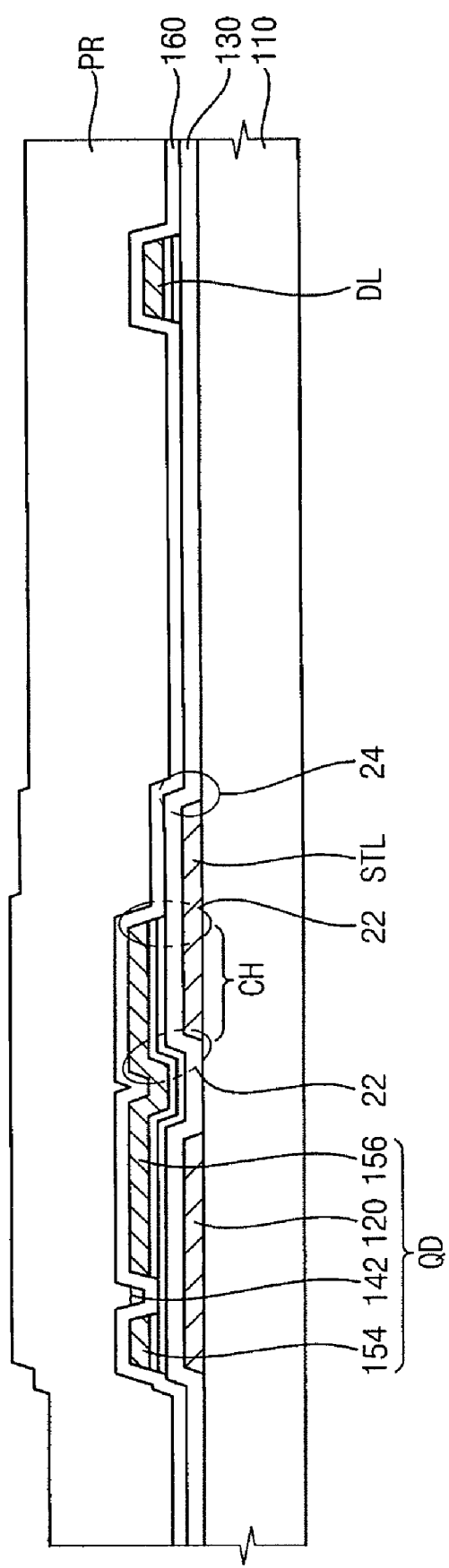

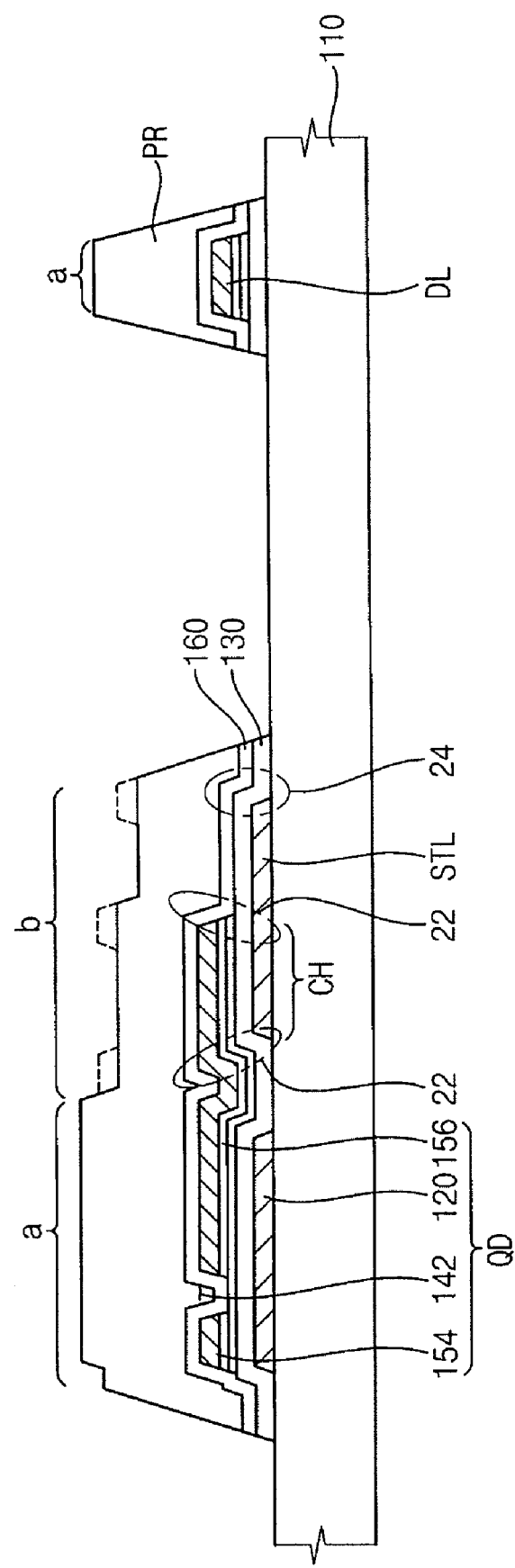

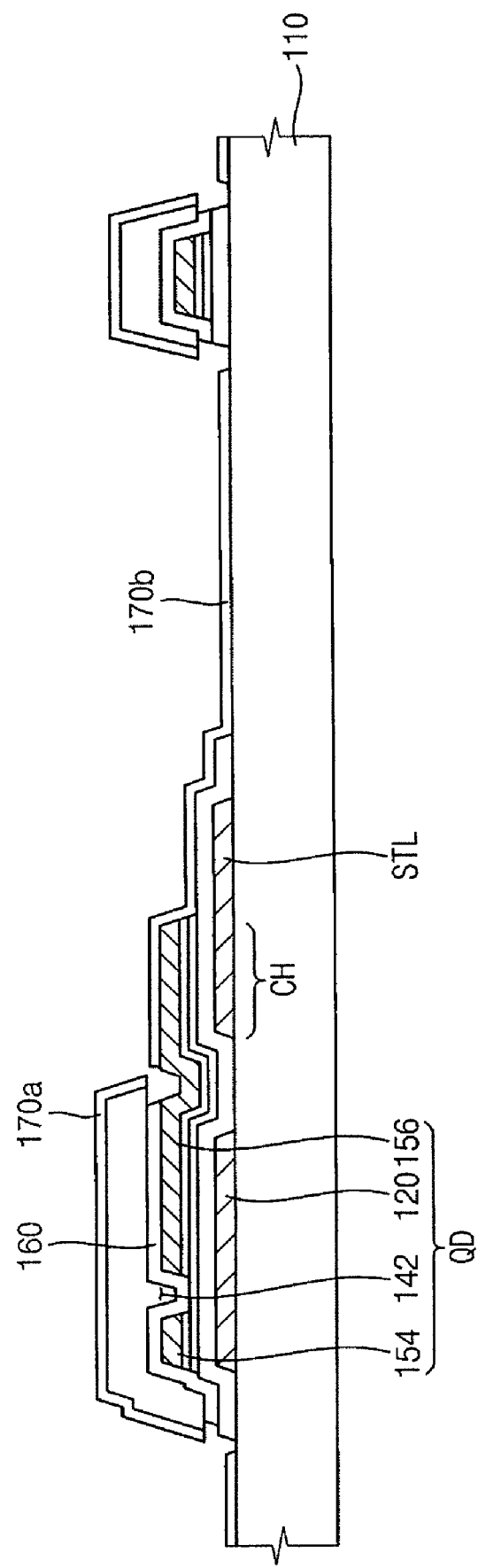

HALFTONE MASK, METHOD OF MANUFACTURING THE SAME, AND METHOD OF MANUFACTURING AN ARRAY SUBSTRATE USING THE SAME

CROSS-REFERENCE TO RELATED APPLICATIONS

This application claims priority under 35 U.S.C. §119 to Korean Patent Application No. 2008-642, filed on Jan. 3, 2008, the disclosure of which is hereby incorporated by reference herein in its entirety.

BACKGROUND OF THE INVENTION

1. Technical Field

The present invention relates to a halftone mask, a method of manufacturing the halftone mask, and a method of manufacturing an array substrate using the halftone mask. More particularly, the present invention relates to a halftone mask having different light-transmittances by in areas, a method of manufacturing the halftone mask, and a method of manufacturing an array substrate using the halftone mask.

2. Description of the Related Art

Generally, a display device displays images by converting electronic data into a visible image, which is processed by an information processing device. Various types of display devices include, but are not limited to cathode ray tubes (CRT), plasma display panels (PDP), liquid crystal display (LCD) devices, and organic light-emitting diode (OLED) display devices.

An LCD device may display images by using liquid crystal, and electrical and optical characteristics of the liquid crystal vary in response to an electric field applied thereto. The LCD device has been widely used in various electronic devices, because the LCD device has many benefits, such as, for example, light weight, thin thickness, low power consumption, etc., in comparison with other types of display devices. The LCD device may include an LCD panel and a backlight assembly providing the LCD panel with light.

The LCD device may include an array substrate, a color filter substrate and a liquid crystal layer interposed between the array substrate and the color filter substrate.

The array substrate may include a plurality of gate lines, a plurality of data lines, a plurality of thin-film transistors (TFTs), a plurality of pixel electrodes and a first alignment layer. The TFT may be formed in a crossing area of the gate line and the data line to perform as a switching element. The pixel electrode may be electrically connected to the TFT. The first alignment layer may be formed to cover the gate lines, the data lines, the TFTs, and the pixel electrode. The gate lines and the data lines may receive a plurality of signals from driving circuits through each of pad parts, respectively. The TFT may provide the pixel electrode with a pixel voltage signal provided from the data line in response to a scan signal provided to the gate line.

The color filter substrate may include a plurality of color filters, a black matrix, a common electrode and a second alignment layer. The color filers may be formed by liquid crystal cell units. The black matrix may be formed between the color filters. The black matrix may reflect external light. The common electrode commonly may provide a reference voltage to the liquid crystal cells. The second alignment layer may be formed to cover the color filters, the black matrix and the common electrode.

To manufacture the LCD panel, each of the array substrate and the color filter substrate is manufactured, the array substrate and the color filter substrate may be combined with each other, and then liquid crystal molecules may be disposed between the array substrate and the color filter substrate.

Recently developed array substrates have been manufactured by using four masks. The array substrate using four masks includes a data line, a channel layer electrically connected to the data line, a drain electrode electrically connected to the channel layer, and a storage capacitance electrode for maintaining an image for one frame. In the LCD panel manufactured by using four masks, a plurality of semiconductor patterns remains. The semiconductor pattern may include an amorphous silicon (a-Si) pattern under the storage capacitance electrode and an amorphous silicon (a-Si) pattern doped with ions at a high concentration.

When fewer exposure masks are used in processes for manufacturing the display substrate, time and costs for manufacturing the display substrate may be reduced and productivity may be enhanced. Recently, a process for manufacturing a display substrate by using three masks has been developed.

The process using three masks uses a first mask to form a gate pattern, a second mask to form a semiconductor pattern and a source pattern, and a third mask to pattern a passivation film to expose a contact part. A pixel electrode is formed through a lift-off method. The passivation film is patterned through two dry-etching processes.

As the size of an LCD panel increases, the manufacturing cost and failure rate of an array substrate having TFTs formed thereon may increase. To decrease the manufacturing cost and the failure rate, a halftone mask which may be alternated with a conventional slit mask has been developed.

In comparison with the slit mask, the halftone mask may readily control the thickness of a remaining photoresist pattern (rTPR) after a mask process.

SUMMARY OF THE INVENTION

Exemplary embodiments of the present invention provide a halftone mask capable of controlling a thickness of a remaining photoresist pattern (which will be referred to hereinafter as rTPR) after a process that is performed through a plurality of halftone layers disposed to have different light transmittance levels from each other.

Exemplary embodiments of the present invention also provide a method of manufacturing the above-mentioned halftone mask.

Exemplary embodiments of the present invention also provide a method of manufacturing an array substrate using the above-mentioned halftone mask.

In accordance with an exemplary embodiment of the present invention, a halftone mask includes a transparent substrate, a light-blocking layer, a first semi-transparent layer and a second semi-transparent layer is provided. The transparent substrate includes a light-blocking area, a light-transmitting area, a first halftone area transmitting first light, and a second halftone area transmitting second light that is less than the first light. The light-blocking layer is formed in the light-blocking area to fully block light from being transmitted. The first semi-transparent layer is formed on the transparent substrate. The second semi-transparent layer is formed on the transparent substrate. Here, at least one of the first semi-transparent layer and the second semi-transparent layer is formed in the first halftone area, and the first and second semi-transparent layers are overlapped with each other on the second halftone area.

In one embodiment, one of the first and second semi-transparent layers may include a material not having an etching selectivity with respect to the light-blocking layer. The remaining semi-transparent layer may include a material having an etching selectivity with respect to the light-blocking layer.

In one embodiment, the light-blocking layer may include chromium (Cr). The first semi-transparent layer may include chromium oxide (CrOx). The second semi-transparent layer may include molybdenum-silicon (MoSi).

In accordance with an exemplary embodiment of the present invention, a method of manufacturing a halftone mask is provided. According to a method of manufacturing the halftone mask, a first photoresist pattern is formed on a second halftone mask and a first halftone mask that are sequentially deposited on a transparent substrate. The exposed portions of the first halftone mask and the second halftone mask are removed by using the first photoresist pattern as a mask. The light-blocking layer is deposited on the whole surface of the transparent substrate. The first photoresist pattern and the light-blocking layer formed on the first photoresist pattern are lifted off and a second photoresist pattern is formed on a portion area of the transparent substrate. The exposed portions of the light-blocking layer and the first halftone mask are removed by using the second photoresist pattern as a mask. The second photoresist pattern is removed.

In still another exemplary embodiment of the present invention, a method of manufacturing a halftone mask is provided. According to a method of manufacturing the halftone mask, a first photoresist pattern is formed on a light-blocking layer deposited on a transparent substrate. The exposed portions of the light-blocking layer are removed by using the first photoresist pattern as a mask. A first halftone layer is formed on the whole surface of the transparent substrate and a second photoresist pattern is formed on a portion area of the transparent substrate. The exposed portions of first halftone layer are removed by using the second photoresist pattern as a mask. A third photoresist film is formed on the portion area of the transparent substrate after removing the second photoresist pattern. A second halftone layer is deposited on a whole surface of the transparent substrate. The second halftone layer is removed by lifting off the third photoresist pattern is removed.

In accordance with still another exemplary embodiment of the present invention, a method of manufacturing a halftone mask is provided. According to a method of manufacturing the halftone mask, a first photoresist pattern is formed on a light-blocking layer deposited on a transparent substrate. The exposed portions of the light-blocking layer are removed by using the first photoresist pattern as a mask. A first halftone layer is formed on the whole surface of the transparent substrate and forming a second photoresist pattern on a portion area of the transparent substrate. The exposed portions of the first halftone layer are removed by using the second photoresist pattern as a mask. A second halftone layer is deposited on a whole surface of the transparent substrate and forming a third photoresist pattern on the deposited second halftone layer. The halftone layer is removed by using the third photoresist pattern as a mask. The third photoresist pattern is removed through a lift-off method.

In further still another exemplary embodiment of the present invention, a method of manufacturing a halftone mask is provided. According to a method of manufacturing the halftone mask, a first photoresist pattern is formed on a first halftone layer, a second halftone layer and a light-blocking layer sequentially deposited on a transparent substrate. The exposed portions of the light-blocking layer are removed by using the first photoresist pattern as a mask. A second photoresist pattern is formed on a portion area of the transparent substrate. The light-blocking layer is removed by using the second photoresist pattern as a mask. A third photoresist pattern is formed on the portion area of the transparent substrate, after removing the second photoresist pattern, and then the first halftone layer is removed by using the third photoresist pattern as a mask. The third photoresist pattern is removed.

In accordance with still another exemplary embodiment of the present invention, a method of manufacturing a halftone mask is provided. According to a method of manufacturing the halftone mask, a first photoresist pattern is formed on a second halftone layer and a light-blocking layer sequentially deposited on a transparent substrate. The exposed portions of the light blocking layer and the second halftone layer are removed by using the first photoresist pattern as a mask. A first halftone layer is deposited on a whole surface of the transparent substrate. A second photoresist pattern is formed on a portion area of the transparent substrate. The first halftone layer is removed by using the second photoresist pattern as a mask. The second photoresist pattern is removed in the portion area of the transparent substrate, and then a third photoresist pattern is formed in the portion area of the transparent substrate in which the second photoresist pattern has been removed. The second halftone layer is removed by using the third photoresist pattern as a mask. The third photoresist pattern is removed.

In accordance with still another exemplary embodiment of the present invention, a method of manufacturing a halftone mask is provided. According to a method of manufacturing the halftone mask, a first photoresist pattern is formed on a light-blocking layer deposited on a transparent substrate, and then a portion of the light-blocking layer is removed by using the first photoresist film as a mask. A second halftone layer and a first halftone layer are sequentially deposited in a whole surface of the transparent substrate. The first photoresist pattern is lifted off to form a second photoresist pattern on a portion area of the transparent substrate. After the first halftone layer and the light-blocking layer are removed by using the second photoresist pattern as a mask, the second photoresist pattern is removed.

In accordance with still another exemplary embodiment of the present invention, a method of manufacturing an array substrate is disclosed. According to a method of manufacturing the array substrate, a gate metal pattern is formed, which includes a gate electrode and a gate line from a first metal layer formed on a transparent substrate by using a first mask. A gate insulation film, an active layer and a second metal layer are formed on the transparent substrate having the gate metal pattern formed thereon, sequentially, and then a photoresist pattern is formed on the second metal layer. A photoresist pattern is patterned in correspondence with a switching area, a storage area and a data area by using a second mask having a light-blocking area, a light-transmitting area, a first halftone area, and a second halftone area. Here, the second mask corresponding to the second halftone area transmits a relatively small amount of light that is smaller than light transmitted through the first halftone area, and blocks the remaining light. The second metal layer exposed between the photoresist patterns is removed, and then a portion of the active layer is removed to form a source-drain electrode pattern and a data line. A photoresist pattern formed on the active layer is removed, and then a photoresist pattern partially exposed on the gate electrode is removed to expose a metal pattern. A metal pattern exposed between the photoresist patterns and a portion of the active layer formed under the metal pattern are removed to form a source electrode and a drain electrode that are spaced apart from each other. A passivation film and an organic insulation layer are formed, in sequence, on a whole surface of a substrate having the source and drain electrodes and the data line formed thereon. The organic insulation layer is patterned by using a third mask having a light-blocking area, a first halftone area transmitting first light and a second halftone area transmitting second light that is smaller than the first light to form a drain contact slit portion exposing a passivation film formed on the drain electrode, and then the organic insulation layer is removed in correspondence with the passivation film formed on the gate metal pattern corresponding to an lower electrode for the storage capacitor to form a storage slit portion. The passivation film in correspondence with the drain contact slit portion, the organic insulation layer remaining in correspondence with the storage slit portion, and a portion of the passivation film are removed to deposit a transparent and conductive metal material. A pixel electrode is formed by using a fourth mask.

In accordance with still another exemplary of the present invention, a method of manufacturing an array substrate is provided. According to a method of manufacturing the array substrate, a first metal pattern including a gate line, a storage line and a gate electrode of a thin-film transistor (TFT) is formed on a transparent substrate by using a first mask. A gate insulation film, a channel layer and a source metal layer are sequentially formed on the transparent substrate having the first metal pattern formed thereon. The source metal layer and the channel layer are patterned by using a second mask to form a second metal pattern having a source line, a source electrode of a TFT and a drain electrode of a TFT and a channel portion. A passivation film and a photoresist film are formed on the second metal pattern. The photoresist film is patterned by using a third mask having a light-blocking area, a light-transmitting area, a first halftone area transmitting first light, and a second halftone area transmitting second light that is smaller than the first light, to form a first pattern portion in correspondence with the gate line, the source line and the TFT, and a second pattern portion formed on the storage line. Here, the second pattern portion is formed with a relatively thicker thickness than the first pattern portion in correspondence with a stepped portion on the storage line. The passivation film and the gate insulation film are etched by using the first and second pattern portions. A pixel electrode is formed by using the first pattern portion.

According to exemplary embodiments of the present invention, a halftone mask, a method of manufacturing the halftone mask, and a method of manufacturing an array substrate by using the halftone mask, a halftone mask having the different light-transmittances by areas is manufactured, so that a thickness of the remaining photoresist pattern may be controlled by in areas during a manufacturing process using the halftone mask so that a thickness of the photoresist pattern may vary. Moreover, according to exemplary embodiments of the present invention, a manufacturing process of the array substrate may be simplified through various thicknesses of the photoresist pattern, and manufacturing errors of the array substrate may be prevented.

BRIEF DESCRIPTION OF THE DRAWINGS

Exemplary embodiments of the present invention can be understood in more detail from the following description taken in conjunction with the accompanying drawings wherein:

FIGS. 5A to 5L are cross-sectional views taken along a line II-II' of an array substrate as shown in FIG. 4;

DETAILED DESCRIPTION OF THE EXEMPLARY EMBODIMENTS OF THE PRESENT INVENTION

Figure 1A:
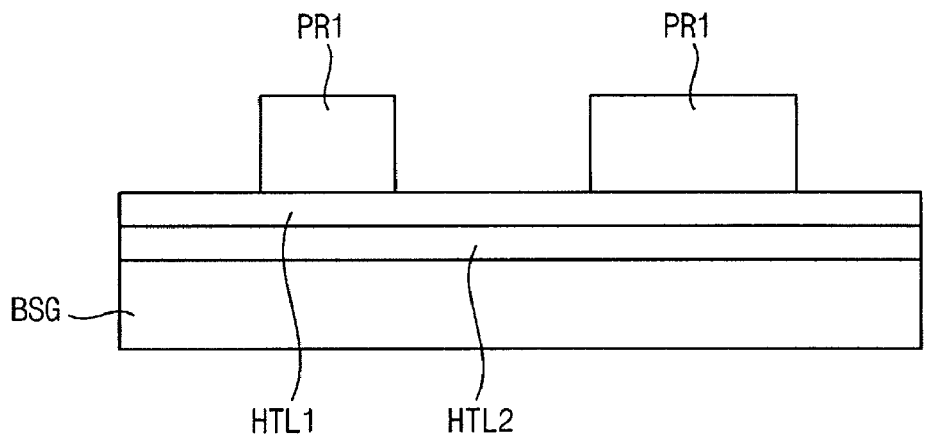
FIGS. 1A to 1F are cross-sectional views illustrating a method of manufacturing a halftone mask according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Exemplary Embodiment 1

Method of Manufacturing a Halftone Mask

FIGS. 1A to 1F are cross-sectional views illustrating a method of manufacturing a halftone mask according to Exemplary Embodiment 1 of the present invention.

Referring to FIG. 1A, a plurality of first photoresist patterns PR1 is formed on a portion of a second halftone layer HTL2 and a first halftone layer HTL1 that are sequentially deposited on a transparent substrate BSG. In this exemplary embodiment, the halftone layer may also sometimes be referred to as a semi-transparent layer. In this exemplary embodiment, a light-blocking layer that blocks light incident into a halftone mask may include, for example, chromium (Cr). Thus, the first halftone layer HTL1 may include a material not having an etching selectivity with chromium (Cr) such as, for example, chromium oxide (CrOx), and the second halftone layer HTL2 may include a material having an etching selectivity with chromium (Cr) such as, for example, molybdenum silicon (MoSi).

Figure 1B:
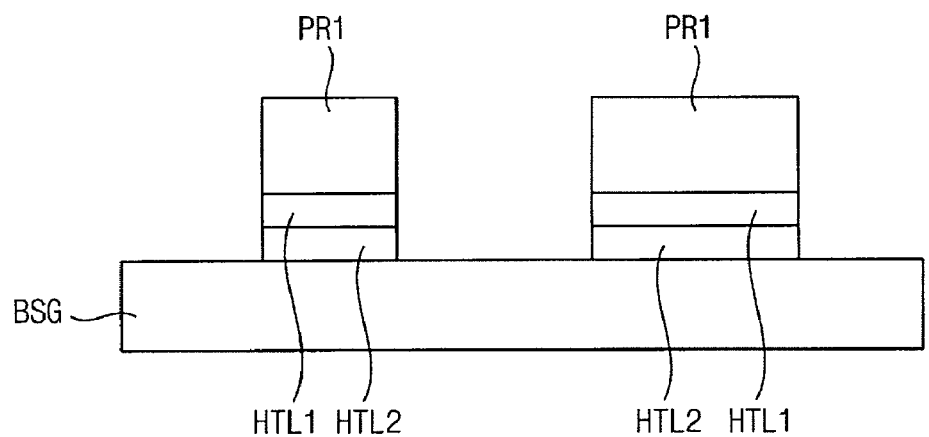

Referring to FIG. 1B, the first and second halftone layers HTL1 and HTL2 are removed, which are formed on a remaining area except the first photoresist patterns PR1, through an etching process including an exposing process, a developing process and a cleaning process by using the first photoresist patterns PR as a mask.

Figure 1C:
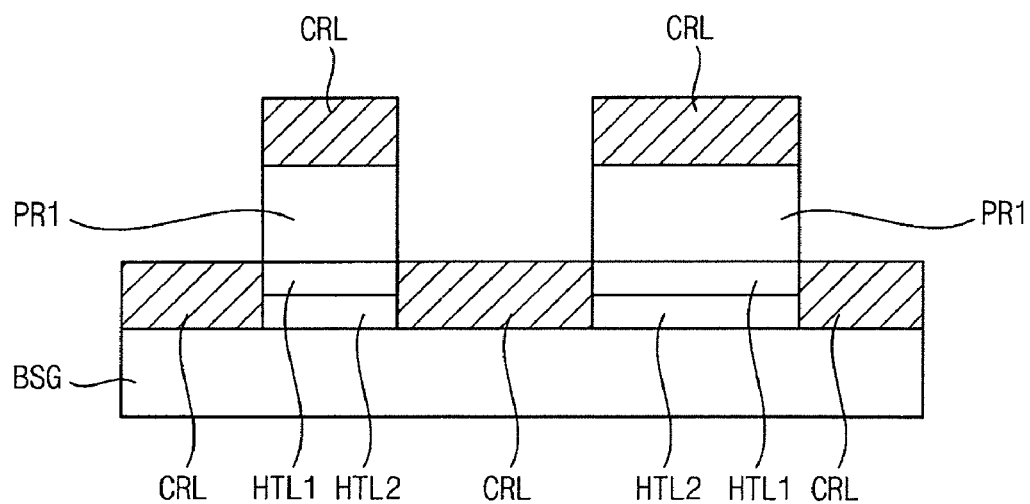

Referring to FIG. 1C, chromium (Cr) is deposited to a whole surface of the resulting product as shown in FIG. 1B.

Figure 1D:
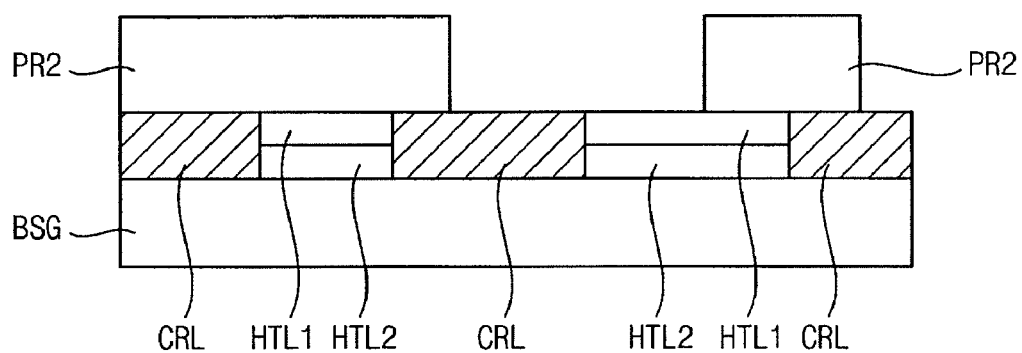

Referring to FIG. 1D, the first photoresist patterns PR1 and the chromium layer CRL formed on the first photoresist patterns PR1 are lifted off, and then a plurality of second photoresist patterns PR2 is formed on a portion of the resulting product. One of the second photoresist patterns PR2 may cover the whole chromium layer CRL and the first halftone layer HTL1, and another of the second photoresist patterns PR2 may cover a portion of the chromium layer CRL and a portion of the first halftone layer HTL1.

Figure 1E:
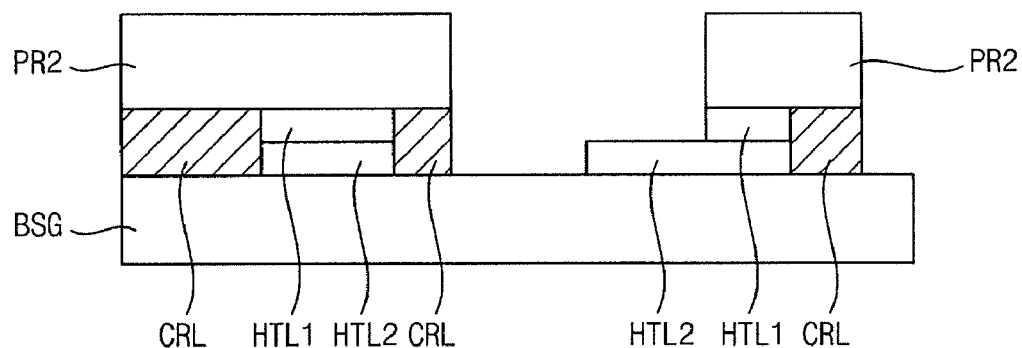

Referring to FIG. 1E, the chromium layer CRL and the first halftone layers HTL1 are removed, which are formed on a remaining area except the second photoresist patterns PR2, through, for example, an etching process including an exposing process, a developing process, a cleaning process, by using the second photoresist patterns PR2 as a mask. Here, the second halftone layer HTL2 has an etching selectivity with chromium (Cr), so that the second halftone layer HTL2 is not removed from the remaining area so as to remain in the remaining area.

Figure 1F:
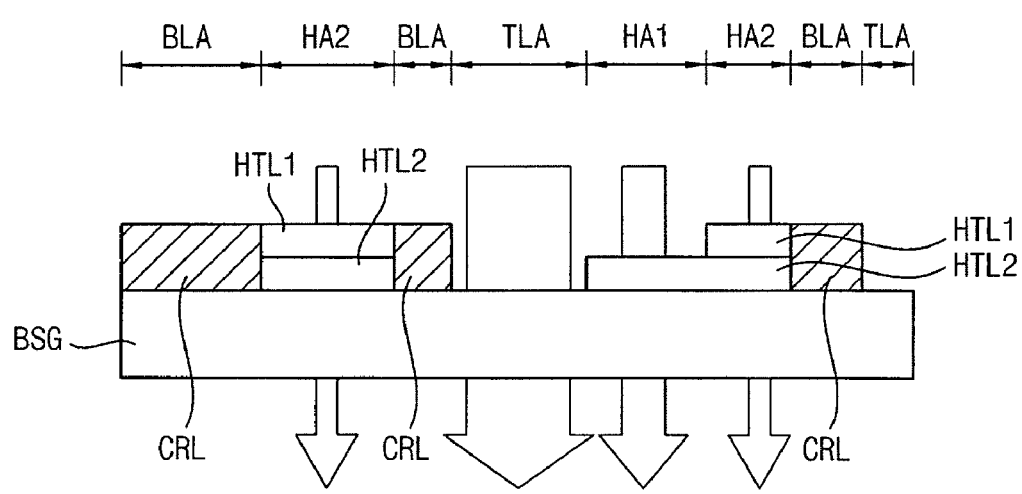

Referring to FIG. 1F, the second photoresist patterns PR2 are removed, so that a halftone mask according to Exemplary Embodiment 1 of the present invention may be completed. In FIG. 1F, the thickness of an arrow represents an amount of light being transmitted through the halftone mask.

The halftone mask according to Exemplary Embodiment 1 of the present invention may include a whole opening area, a covered area by the second halftone layer HTL2, a covered area by the first and second halftone layers HTL1 and HTL2, and a whole covered area by the chromium layer CRL.

Thus, the whole opening area may define a light-transmitting area TLA, the covered area by the second halftone layer HTL2 may define a first halftone area HA1 that transmits a relatively large amount of light, and the covered area by the first and second halftone layers HTL1 and HTL2 may define a second halftone area HA2 that transmits a relatively small amount of light. The whole covered area by the chromium layer CRL may define a light-blocking area BLA.

Accordingly, the light transmittance of the halftone mask according to Exemplary Embodiment 1 of the present invention may be controlled by a thickness of the halftone layers. Thus, in a process in which the same exposure amounts are irradiated using the halftone mask, the remaining photoresist pattern has a relatively thick thickness when the light transmittance is relatively high, and the remaining photoresist pattern has a relatively thin thickness when the light transmittance is relatively low.

Hereinafter, a method of manufacturing an array substrate by using a differential halftone mask in accordance with an exemplary embodiment of the present invention will be described.

Method of Manufacturing an Array Substrate

Figure 2:
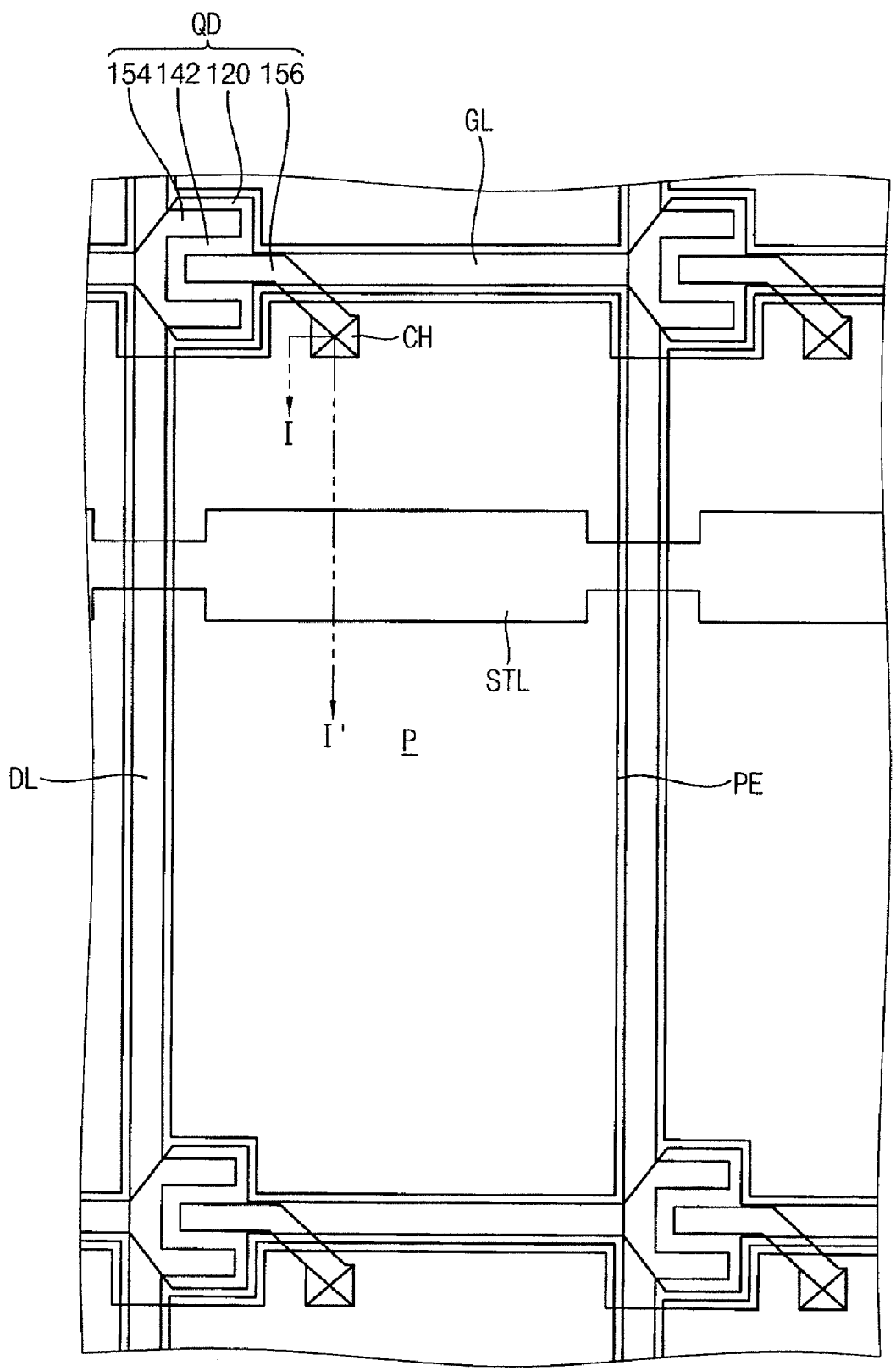
FIG. 2 is a plan view illustrating a method of manufacturing an array substrate according to an exemplary embodiment of the present invention.

FIG. 2 is a plan view illustrating a method of manufacturing an array substrate according to Exemplary Embodiment 1 of the present invention. FIGS. 3A to 3E are cross-sectional views taken along a line I-I' of an array substrate as shown in FIG. 2.

Figure 3A:
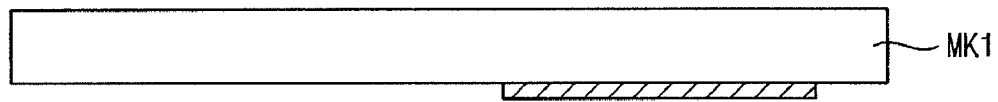
FIGS. 3A to 3E are cross-sectional views taken along a line I-I' of an array substrate as shown in FIG. 2.

Referring to FIGS. 2 and 3A, a first metal layer is formed on a transparent substrate 10. The first metal layer may include, for example, an aluminum (Al)-based metal such as aluminum, aluminum alloy, etc., a silver (Ag)-based metal such as silver, silver alloy, etc., a copper (Cu)-based metal such as copper, copper alloy, etc., a molybdenum (Mo)-based metal such as molybdenum, molybdenum alloy, etc., and a metal including chromium (Cr), titanium (Ti), tantalum (Ta), tungsten (W), silver (Ag), copper (Cu), an alloy thereof, etc. The first metal layer may be deposited through a sputtering process. Alternatively, the first metal layer may include a multilayer structure that includes two electrically conductive films that are different from each other.

Then, a portion of the first metal layer is etched through a photo etching process using a first mask MK1 to form a gate metal pattern and a storage pattern STL. The gate metal pattern includes a gate line GL and a gate electrode 120 extended from the gate line GL to be extruded. The gate line GL and the storage electrode pattern STL are extended toward a first direction, for example, the X-axis direction when viewed on a plane.

Figure 3B:
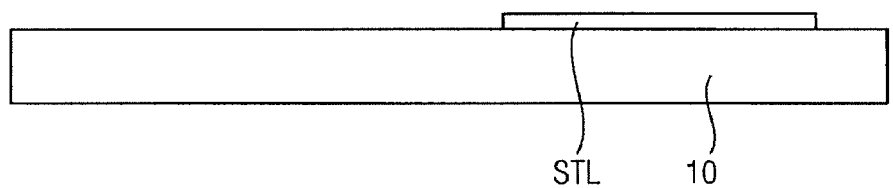

Referring to FIGS. 2 and 3B, a gate insulation film 12, an active layer 142 and a second metal layer are formed on a whole surface of the transparent substrate 10 having the gate metal pattern and the storage electrode pattern STL formed thereon. The active layer 142 may include, for example, an amorphous silicon (a-Si) layer and an n+ amorphous silicon (n+ a-Si) layer that is formed by implanting n+ impurities at a high concentration. The n+ amorphous silicon (n+ a-Si) layer is formed on the amorphous silicon (a-Si) layer. The gate insulation film 12 may include, for example, silicon nitride (SiNx) and silicon oxide ($SiO_2$). The gate insulation film 12 may be formed by using, for example, chemical vapor deposition (CVD) such as plasma enhanced chemical vapor deposition (PECVD), physical vapor deposition (PVD) such as a sputtering process, etc. The second metal layer may be formed from a single metallic material such as, for example, chromium (Cr), molybdenum (Mo), tungsten (W), tantalum (Ta), aluminum (Al), neodymium (Nd), titanium (Ti), copper (Cu), silver (Ag), etc., or a metal alloy thereof.

Then, a photoresist (e.g., a radiation-sensitive material) layer PR is formed on the second metal layer. Here, the photoresist film PR includes a positive photoresist. When a positive photoresist is used as the photoresist film PR, the portions of the photoresist film PR that were exposed to an electron beam are removed during a development process.

Then, a second mask MK2 having a light-transmitting area, a light-blocking area and a halftone area formed therein is positioned on a substrate having the photoresist film PR. The halftone area is positioned in correspondence with an upper portion of the gate electrode. Here, the photoresist film PR corresponding to the halftone area may have characteristics that a portion is only exposed with respect to the light-transmitting area.

Then, an exposure process that exposes light on the second mask MK2 and a developing process that removes the exposed portion are performed. Thus, a patterned photoresist film PR is formed at a switching area, a storage area and a data area. The switching area corresponds to a thin-film transistor (TFT), the storage area corresponds to the storage electrode pattern STL, and the data area corresponds to the data line DL.

Then, the second metal layer is exposed between the patterned photoresist films PR, and then the n+ amorphous silicon (n+ a-Si) layer and the amorphous silicon (a-Si) layer are etched. The second metal layer may be formed through a wet-etching process, and the n+ amorphous silicon (n+ a-Si) layer and the amorphous silicon (a-Si) layer may be formed through a dry-etching process. Thus, a source-drain electrode pattern and a data line that is extended from the source-drain electrode are formed in the switching area and the data area, respectively.

Then, to form a channel in the switching area, an ashing process is performed to remove the photoresist film PR formed on the channel. Thus, a thin photoresist film PR exposed in an upper area of the gate electrode is removed, and simultaneously a peripheral portion of each PR pattern is removed to expose a lower metal pattern.

Then, the metal layer exposed between the PR patterns and the n+ amorphous silicon (n+ a-Si) layer formed under the metal layer are removed through a dry-etching process to expose the amorphous silicon (a-Si) layer.

When the metal layer exposed between the patterned photoresist films PR may include, for example, molybdenum (Mo), the metal layer exposed by a dry-etching process and the n+ amorphous silicon (n+ a-Si) layer may be removed simultaneously. Alternatively, when the metal layer exposed between the patterned photoresist films PR may include, for example, chromium (Cr), the metal layer exposed between the PR patterns is removed through a wet-etching process, and then serially the n+ amorphous silicon (n+ a-Si) layer may be removed.

The source-drain electrode patterns are again patterned in the switching area through the above process, so that a source electrode and a drain electrode spaced apart from each other are formed and an active channel area corresponding to the active layer is exposed between the source electrode and the drain electrode.

Thus, an active layer 142, a source electrode 154, a drain electrode 156 and a data line DL are formed through a second masking process.

Figure 3C:
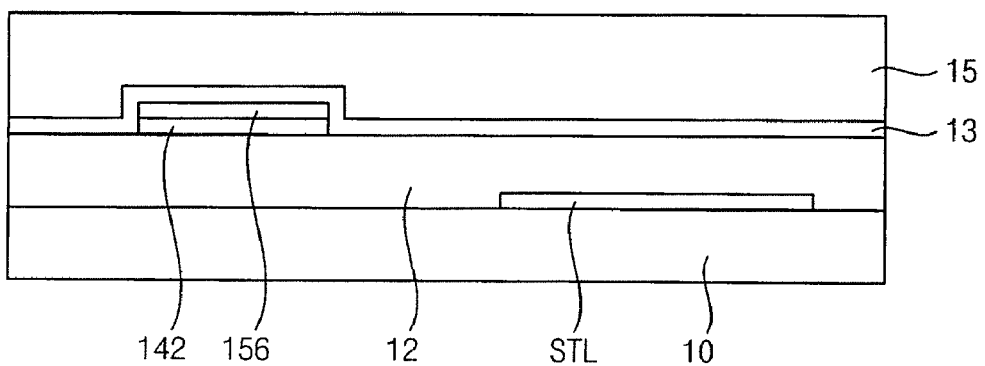

Referring to FIGS. 2 and 3C, a passivation film 13 and an organic insulation layer 15 are sequentially formed on a whole surface of the transparent substrate 10 having the source and drain electrodes 154 and 156, the data line DL, etc., formed thereon.

Figure 3D:
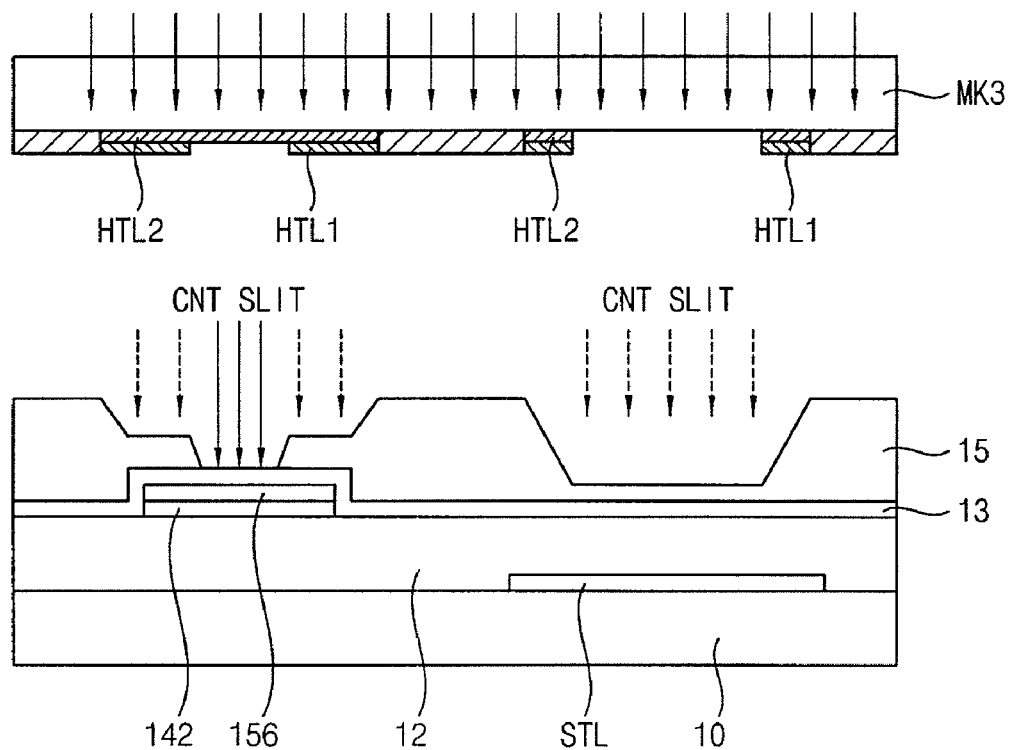
Figure 3E:
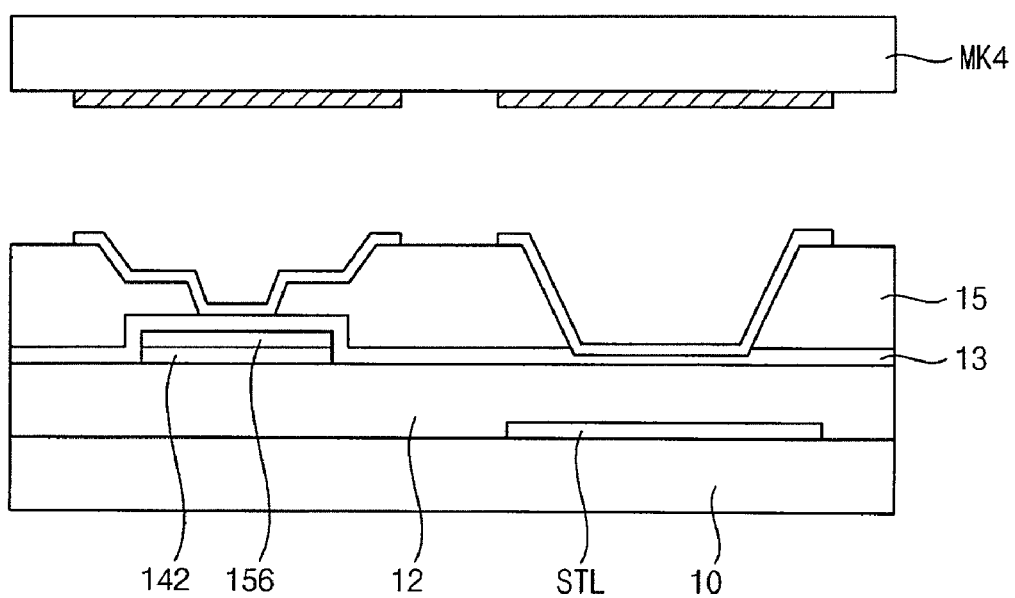

Referring to FIGS. 2 and 3D, the organic insulation layer 15 is patterned through a photo etching process using a third mask MK3 to form a drain contact slit portion exposing a passivation film 13 formed on the drain electrode 156, and the organic insulation layer 15 corresponding to the passivation film 13 formed on the gate metal pattern in correspondence with a lower electrode for the storage capacitor STL is removed to form a storage slit portion.

The thickness of the remaining photoresist pattern corresponding to the drain contact slit area CNT Slit is thicker than that of the remaining photoresist pattern of the storage slit area Cst Slit corresponding to the storage slit portion. Therefore, a halftone mask is disposed, which has a low light-transmittance area (e.g., a second halftone area HA2) in correspondence with the contact slit area and a high transmittance area (e.g., a first halftone area HA1) in correspondence with the storage slit area. Thus, a slit mask, that is conventionally used, may be replaced with a halftone mask having a superior process margin.

Then, a passivation film 13 exposed in correspondence with the contact slit area CNT Slit, and the remaining organic insulation layer 15 and a portion of the passivation film 13, both of which remain in correspondence with the storage slit area Cst Slit, are removed through an ashing process.

Referring to FIGS. 2 and 3C, an optically transparent and electrically conductive metal material such as, for example, indium tin oxide (ITO), indium zinc oxide (IZO), amorphous indium tin oxide (a-ITO), etc., is deposited on the organic insulation layer 15. Then, the optically transparent and electrically conductive material is patterned through a four-mask process to form a transparent pixel electrode that is electrically connected to the drain electrode 156 and is contact with the metal pattern via the pixel area. An array substrate for a liquid crystal display (LCD) device may be manufactured through the above process.

As described above, in an array substrate manufactured through the four-mask process, a halftone mask according to an exemplary embodiment of the present invention is used when a contact area and a storage area are formed, so that a process margin may be secured in comparison with a manufacturing process using a multi-slit mask.

Method of Manufacturing an Array Substrate

Figure 4:
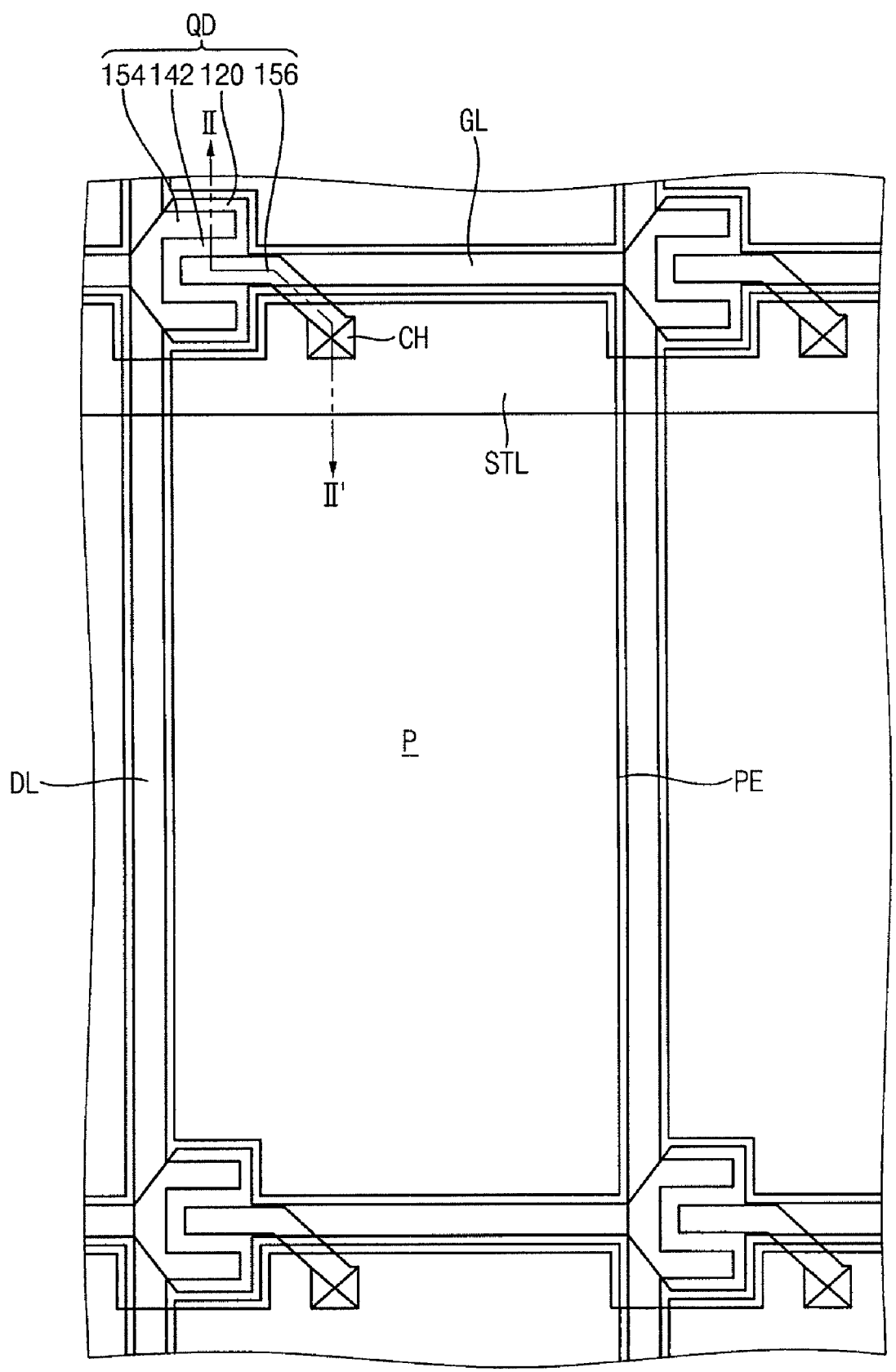
FIG. 4 is a plan view illustrating a method of manufacturing an array substrate according to an exemplary embodiment of the present invention.

FIG. 4 is a plan view illustrating a method of manufacturing an array substrate according to Exemplary Embodiment 2 of the present invention. FIGS. 5A to 5L are cross-sectional views taken along a line II-II' of an array substrate as shown in FIG. 4.

Referring to FIGS. 4 and 5A, a first metal layer is formed on a transparent substrate 110. The first metal layer may include, for example, a single layer structure, a double layer structure, a multilayer structure, etc. In one example, when the first metal layer includes the single layer structure, the first metal layer is formed from a single metallic material such as aluminum (Al), molybdenum (Mo), neodymium (Nd), chromium (Cr), tantalum (Ta), titanium (Ti), tungsten (W), copper (Cu), silver (Ag), etc., or a metal alloy thereof. In another example, when the first metal layer includes the double layer structure, a lower metal layer of the first metal layer is formed a material having relatively high mechanical and chemical characteristics such as aluminum (Al) and an upper metal layer of the first metal layer is formed a material having a relatively low resistance such as molybdenum (Mo), molybdenum alloy, etc. The first metal layer may be formed, for example, through a sputtering process.

Then, a portion of the first metal layer is etched through a photo etching process using a first mask MK1 to form a first metal pattern including a gate line GL, a gate electrode 120 connected to the gate line GL and a storage common line STL. The gate line GL may be extended toward the X-axis direction when viewed on a plane, and the storage common line STL may be extended between the gate lines GL adjacent to each other toward the first direction.

Referring to FIGS. 4 and 5B, a gate insulation film 130 is formed on a transparent substrate 110 having the first metal pattern to cover the first metal pattern. For example, the gate insulation film 130 is formed by a silicon oxide (SiO2) layer or a silicon nitride (SiNx) layer. The gate insulation film 130 may have a thickness of about 1,500 Å to about 2,500 Å. The gate insulation film 130 may be formed by using, for example, CVD such as PECVD, PVD such as a sputtering process, etc. Then, an active layer 140a including amorphous silicon (a-Si:H) and an ohmic contact layer 140b including n+ amorphous silicon (n+ a-Si:H) that is formed by implanting N+ impurities having a high concentration are sequentially formed on the gate insulation film 130. The active layer 140a and the ohmic contact layer 140b may be formed by using, for example, PECVD.

Then, a second metal layer 150 is formed on the ohmic contact layer 140b. For one example, the second metal layer 150 may include, for example, an aluminum (Al)-based metal such as aluminum, aluminum alloy, etc., a silver (Ag)-based metal such as silver, silver alloy, etc., a copper (Cu)-based metal such as copper, copper alloy, etc., a molybdenum (Mo)-based metal such as molybdenum, molybdenum alloy, etc., and a metal including chromium (Cr), titanium (Ti), tantalum (Ta), tungsten (W), silver (Ag), copper (Cu), an alloy thereof, etc. The second metal layer 150 may be deposited through, for example, a sputtering process. In another example, the second metal layer 150 may include a multilayer structure that includes two electrically conductive films that are different from each other. In still another example, the second metal layer 150 may include a triple layer structure that includes a molybdenum (Mo) layer/an aluminum (Al) layer/ a molybdenum (Mo) layer that are sequentially deposited thereon.

Then, a photoresist film PR is formed on the whole surface of the second metal layer 150, and then the photoresist film PR is patterned by using a second mask MK2. Here, the photoresist film PR includes, for example, a positive photoresist. When a positive photoresist is used as the photoresist film PR, the portions of the photoresist film PR that were exposed to an electron beam are removed during a development process.

The second mask MK2 may have an opening portion, a light-blocking portion and a halftone portion that are defined at the transparent substrate 210. The light-blocking portion may include, for example, a chromium layer (CRL). The halftone portion may have at least one of a first halftone layer HTL1 and a second halftone layer HTL2.

The opening portion is an area transmitting light of about 100%, and a photoresist film PR in correspondence with the opening portion may be resolved by a developing solution. The light-blocking portion is as an area where a light is not transmitted. The photoresist pattern PR corresponding to the light-blocking portion is not resolved by a developing solution. The halftone portion is an area where at least one of the halftone layers is formed. A portion of light is transmitted through the halftone layer. Thus, a portion of the photoresist film PR is exposed, which corresponds to the halftone portion. Therefore, when the photoresist film PR corresponding to the halftone portion is developed, the developed photoresist film PR remains, which is thinner than the photoresist film PR corresponding to the light-blocking portion.

Therefore, the photoresist pattern PR corresponding to the light-blocking portion be to a first thickness portion 12, and the photoresist pattern PR corresponding to the halftone portion be to a second thickness portion 14 that is thinner than the first thickness portion 12. Here, the first thickness portion 12 is a pattern portion for forming a data line DL, a source electrode 154 and a drain electrode 156 of a display TFT QD, and the second thickness 14 is a pattern portion for forming a channel portion 142 of the display TFT QD.

Figure 5C:
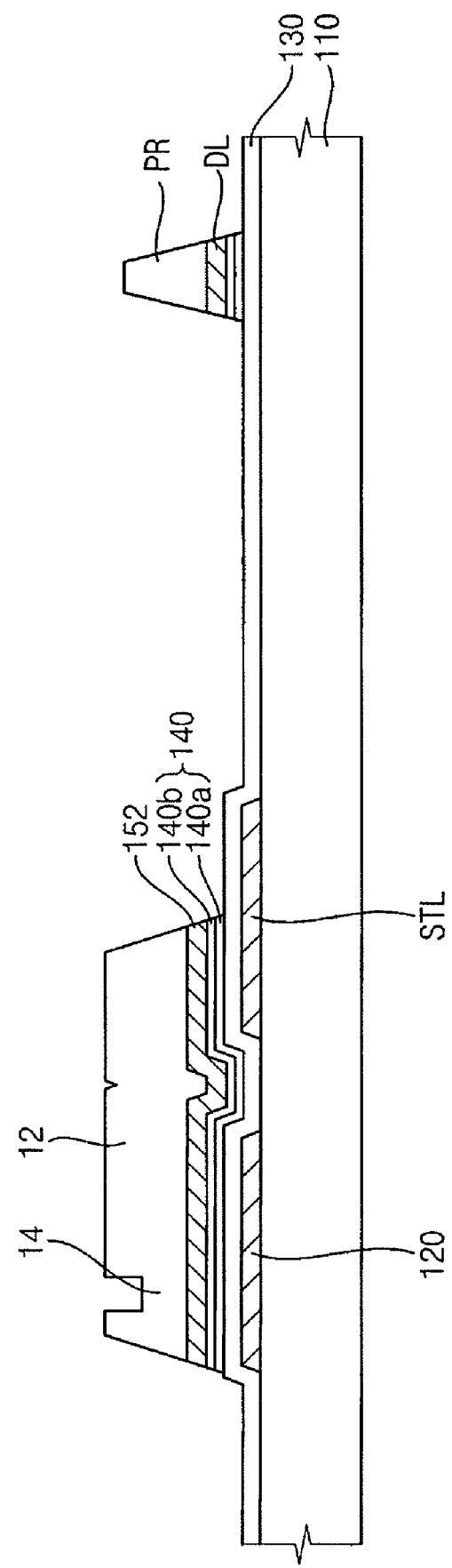

Referring to FIGS. 4 and 5C, the metal layer 150 is wet-etched by using the first and second thickness portions 12 and 14. Thus, a second metal pattern including an electrode pattern 152 and a data line DL. The electrode pattern 152 is overlapped with a portion of the gate electrode 120 and a portion of the storage common electrode line STL. The data line DL is extended along a second direction crossing the first direction, for example, the Y-axis when viewed on a plane. A plurality of pixel portions P is defined by the gate lines GL extended in the first direction and the data lines DL crossing the second direction on the transparent substrate 110.

Then, the activation layer 140a and the ohmic contact layer 140b are etched by using the second metal pattern as an etching mask. For example, the activation layer 140a and the ohmic contact layer 140b may be etched through a dry-etching process. When the dry-etching process is finished, a channel layer 140 is formed under the second metal pattern.

Referring to FIGS. 4 and 5D, the photoresist pattern PR is removed by a predetermined thickness through an ashing process using oxygen plasma. Thus, the second thickness portion 14 is removed, which is thinner than the first thickness portion 12, and the first thickness portion 12 remains with a predetermined thickness. The electrode pattern 152 is exposed in an area where the second thickness portion 14 is removed.

Referring to FIGS. 4 and 5E, the electrode pattern 152 is etched by using the first thickness portion 12 as an etching mask. For example, the electrode pattern 152 may be etched through a wet-etching process. Thus, a source electrode 154 of the TFT and a drain electrode 156 spaced apart from the source electrode 154 are formed. The drain electrode 156 may include a contact portion CH overlapped with the storage common electrode STL. A first stepped portion 22 is formed in an edge area of the contact portion CH. A second stepped portion 24 is formed between an edge area of the storage common line STL and the transparent substrate 110.

Then, the ohmic contact layer 140b is dry-etched by using the source electrode 154 and the drain electrode 156 as an etching mask. Thus, a channel portion 142 is formed between the source electrode 154 and the drain electrode 156, which exposes the activation layer 140a. Then, the first thickness portion 12 is removed through an ashing process using oxygen plasma, which remains on the source electrode 154 and the drain electrode 156. Thus, the display TFT QD is formed on the transparent substrate 110, which includes the gate electrode 120, the source electrode 154, the drain electrode 156 and the channel portion 142.

Referring to FIGS. 4 and 5F, a passivation film 160 and a photoresist pattern PR are sequentially formed on the gate insulation film 130 having the display TFT QD formed thereon. The passivation film 160 may be formed from, for example, a silicon nitride (SiNx) layer or a silicon oxide (SiOx) layer, and be formed by using, for example, CVD process such as PECVD, PVD such as a sputtering process, etc. The photoresist pattern PR may be formed from a positive photoresist. When a positive photoresist is used as the photoresist film PR, the portions of the photoresist film PR that were exposed to an electron beam are removed during a development process.

Figure 5G:
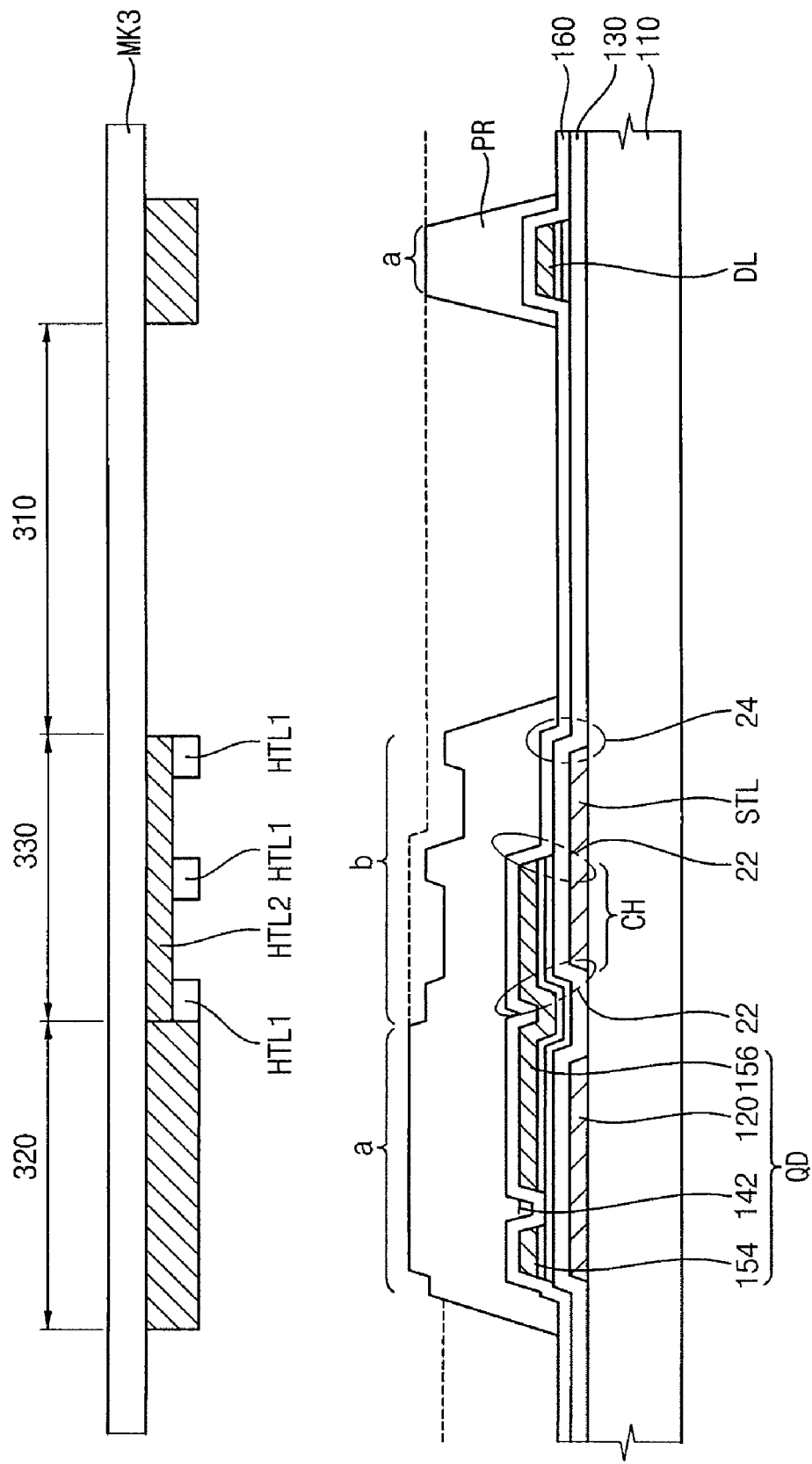

Referring to FIGS. 4 and 5G, a third mask MK3 is disposed on the photoresist film PR, which has an opening portion 310, a light-blocking portion 320 and a halftone portion 330. That is, the third mask MK3 is a halftone mask having the differential halftone layers according to exemplary embodiments of the present invention.

The opening 310 is disposed in correspondence with remaining area except the data line DL, the gate line GL, the display TFT QD and the storage common line STL. The photoresist pattern PR corresponding to the opening 310 is removed by a developing solution, so that the passivation film 160 is exposed in the transparent substrate 110 corresponding to the opening 310.

The light-blocking portion 320 is disposed in correspondence with the data line DL, the gate line GL and the display TFT QD. When the positive photoresist is used, the light-blocked area is not resolved by a developing solution. Thus, when the photoresist film PR is developed, a first pattern portion 'a' is formed in correspondence with the display TFT QD, the data line DL and the gate line GL, which has the same thickness as before the photoresist film PR is developed.

The halftone portion 330 is disposed in correspondence with the storage common line STL. A portion of light is transmitted through the halftone portion 330, so that a few of photoresist patterns PR corresponding to the halftone portion 330 is solved by a developing solution. Thus, the photoresist pattern PR remains in the halftone portion 330, which is thinner than the first pattern portion 'a'.

For example, the halftone portion 330 include a first halftone area having a second halftone layer HTL2 formed thereon to transmit a relatively large amount of light, and a second halftone area having the second and first halftone layers HTL2 and HTL1 overlapped with each other to transmit a relatively small amount of light. The first halftone area is disposed in correspondence with the first and second stepped portions 22 and 24 formed on the storage common line STL. The first halftone layer HTL1 is further formed in the second halftone area in comparison with the first halftone area, so that light transmittance may be decreased. Thus, when the exposed photoresist film PR is developed, a second pattern portion 'b' having a relatively thicker thickness is formed in correspondence with the first and second stepped portions 22 and 24. The second pattern portion 'b' is formed with a relatively thicker thickness in correspondence with the first and second stepped portions 22 and 24, so that an exposing of a metal pattern formed in the first and second stepped portions 22 and 24 may be prevented during a first dry-etching process and a second etching process which are described below.

The photoresist pattern PR may have fluidity by a heat curing process which will be described later. Therefore, as a photoresist reflow phenomenon is that the photoresist pattern PR corresponding to the first and second stepped portions 22 and 24 flows to a lower portion thereof, a thickness of the photoresist pattern PR corresponding to the first and second stepped portions 22 and 24 is decreased. Moreover, the photoresist pattern PR is etched by a predetermined thickness through oxygen gas (O₂) used in a first dry-etching process which will be described later. Thus, the thickness of the photoresist pattern PR corresponding to the first and second stepped portions 22 and 24 is more decreased. Thus, in the following dry-etching process, an etching preventing function of a passivation film 160 corresponding to the first and second stepped portions 22 and 24 may be decreased.

However, the photoresist pattern PR corresponding to the first and second stepped portions 22 and 24 is formed with a relatively thicker thickness, the passivation film 160 corresponding to the first and second stepped portions 22 and 24 may be prevented from being over-etched. Therefore, an exposing of the metal pattern formed under the passivation film 160 may be prevented, so that a short error of a pixel electrode which will be formed later may be prevented.

An exposure amount is increased at a central portion of the halftone portion 330 of a boundary portion between the halftone portion 330 and the opening 310. When the exposed photoresist layer is developed, the photoresist pattern PR corresponding to the boundary portion remains with a relatively thinner thickness. Therefore, the first area 332 that has lower light transmittance than the second area 334 is formed in the halftone portion 330 adjacent to the opening portion 310, so that a thickness decreasing of the photoresist pattern PR corresponding to the boundary portion may be prevented.

In this exemplary embodiment, the photoresist pattern using the positive photoresist is formed. However, the photoresist pattern may be formed by using a negative photoresist. When the negative photoresist is used, the opening portion and the light-blocking portion of the third mask that is a halftone mask are formed in the different areas being contrary to each other. Moreover, the first and second areas of the halftone portion are formed in the different areas being contrary to each other.

Referring to FIGS. 4 and 5H, a heat curing process is performed to the photoresist pattern PR. When a heat curing process is performed to the photoresist pattern PR, the photoresist pattern PR may have fluidity by a heat. Therefore, a photoresist reflow phenomenon is that the photoresist pattern PR corresponding to the first and second stepped portions 22 and 24 flows to a lower portion thereof, so that a thickness of the photoresist pattern PR corresponding to the first and second stepped portions 22 and 24 is decreased so that a thickness of the second pattern portion 'b' is uniform.

Then, the passivation film 160 and the gate insulation film 130 are first dry-etched by using the cured photoresist film PR as a dry mask. The transparent substrate 110 is exposed in an area where the passivation film 160 and the gate insulation film 130 are etched. To perform the dry-etching process, an etching gas such as, for example, a sulfur hexafluoride ($SF_6$) gas and a carbon tetrafluoride ($CF_4$) gas may be used. Alternatively, the etching gas may include, for example, oxygen ($O_2$) gas so as to enhance an etching uniformity. The oxygen ($O_2$) gas may etch the photoresist pattern PR. Thus, when the dry-etching process is performed, a portion of the photoresist pattern PR may be etched. Here, the second pattern portion 'b' having a uniform thickness remains on the first and second stepped portions 22 and 24 of the storage common line STL, so that an over exposing of the first and second stepped portions 22 and 24 by the first dry-etching process may be prevented.

Figure 5I:
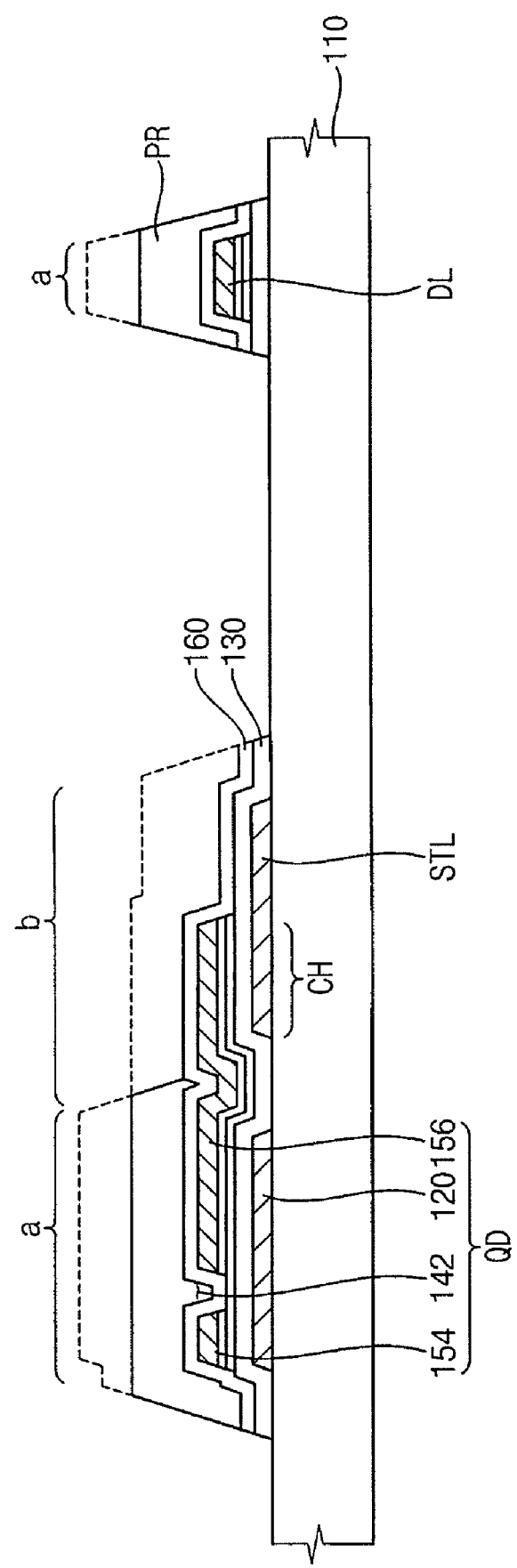

Referring to FIGS. 4 and 5I, an ashing process using oxygen plasma is performed, the photoresist pattern PR is removed by a predetermined thickness. Thus, the second pattern portion 'b' is removed, which is formed with a thinner than the first pattern portion 'a' in correspondence with the storage common line STL. The first pattern portion 'a' remains with a predetermined thickness in correspondence with the data line DL, the gate line GL and the display TFT QD.

Figure 5J:
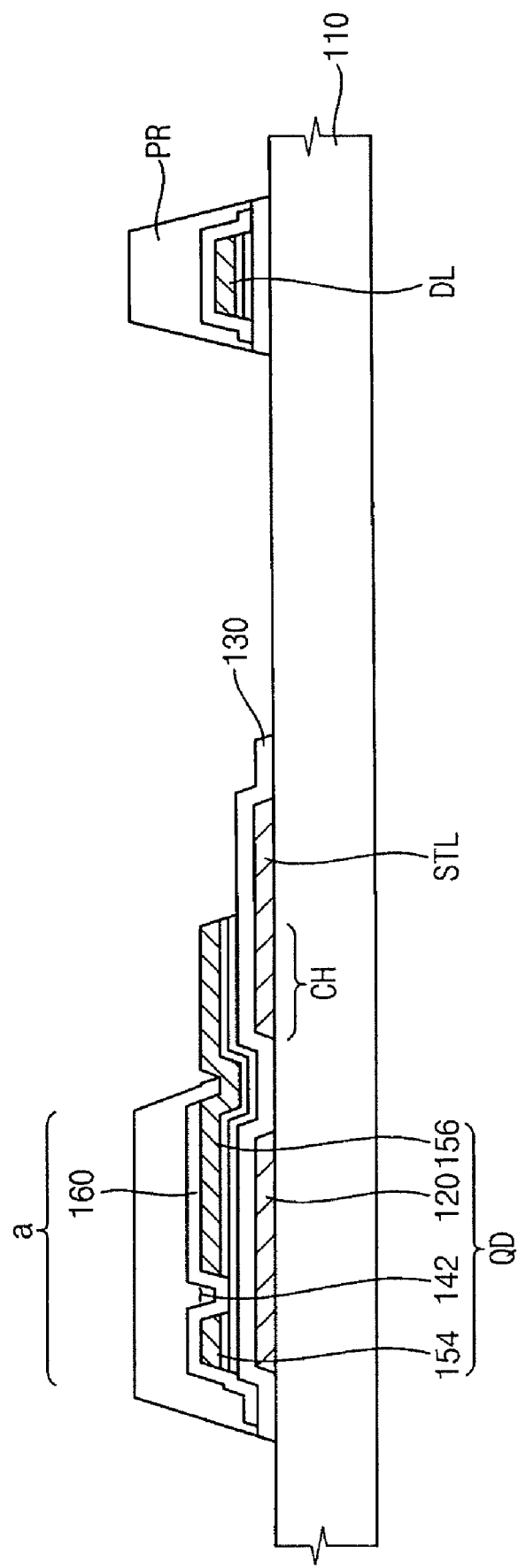

Referring to FIGS. 4 and 5J, the passivation film 160 is second dry-etched by using the remaining first pattern portion 'a' as an etching mask. Thus, the contact portion CH formed on the storage common line STL is exposed. The dry-etching process is performed by using, for example, an isotropic etching process, so that an under-cutting is generated, which the passivation film 160 is more depressed than the first pattern portion 'a'.

Referring to FIGS. 4 and 5K, a coating layer including an optically transparent and electrically conductive material is formed on the transparent substrate 110 to cover the first pattern portion. The optically transparent and electrically conductive material may include, for example, indium tin oxide (ITO), indium zinc oxide (IZO), amorphous indium tin oxide (a-ITO), etc. When the coating layer is deposited on the transparent substrate 110, a first coating layer 170a formed on the first pattern portion 'a' and a second coating layer 170b formed on the transparent substrate 110 are electrically disconnected from each other due to the under-cutting 'U'.

Figure 5L:
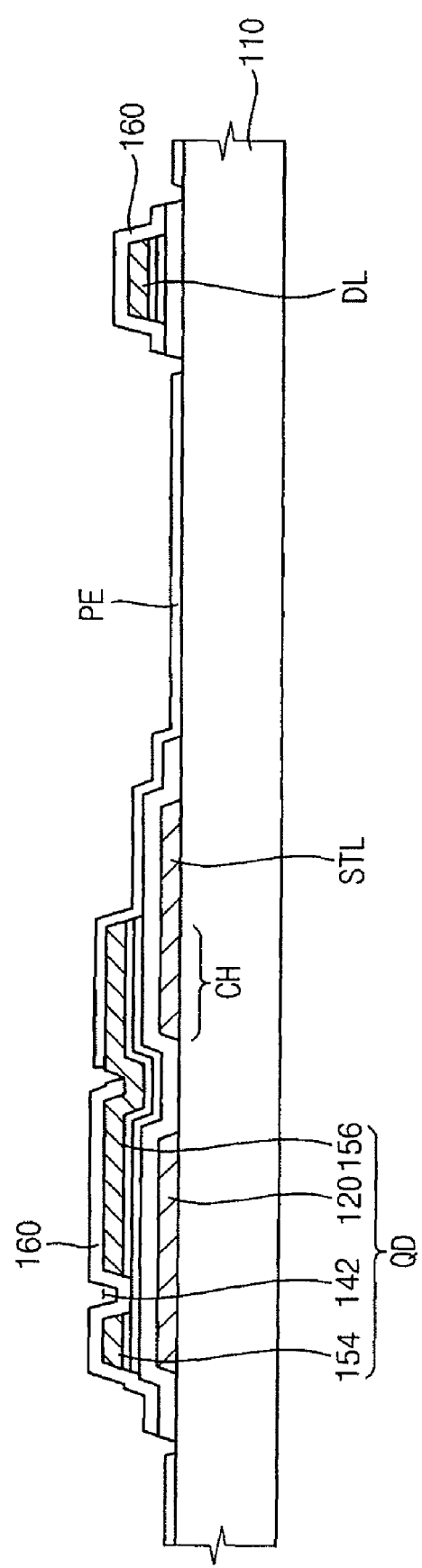

Referring to FIGS. 4 and 5L, the transparent substrate 110 having the first pattern portion 'a' formed thereon is put in a photoresist stripper solution. The photoresist stripper solution is infiltrated to the first pattern portion 'a' to remove the first pattern portion 'a'. Here, the first pattern portion 'a' is removed, and simultaneously the coating layer 170a formed on the first pattern portion 'a' is removed.

Therefore, a pixel electrode PE electrically contacting with the drain electrode 156 through the contact portion CH is formed on the pixel part P.

Hereinafter, a photoresist pattern remaining with a uniform thickness by a halftone mask according to an exemplary embodiment of the present invention will be described.

Figure 6A:
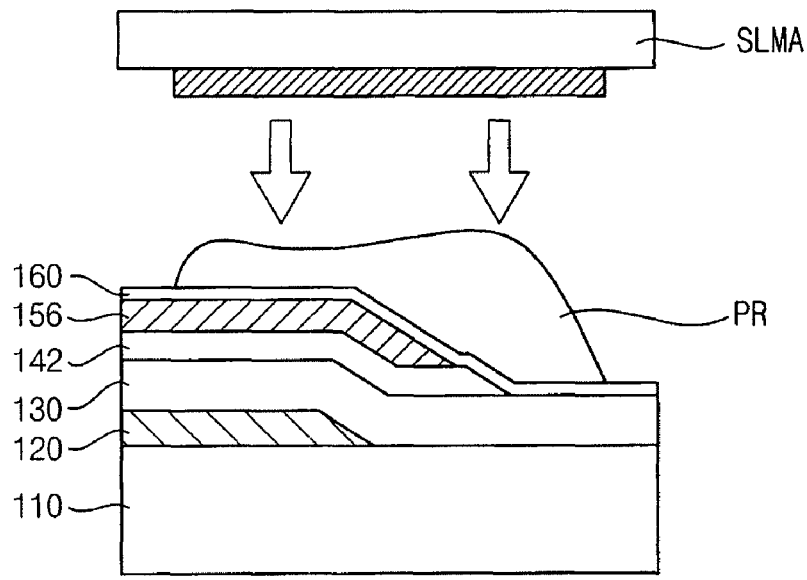
FIG. 6A is a cross-sectional view illustrating an inclined portion of a thin-film transistor (TFT) of an array substrate manufactured through a conventional multi-slit mask.
Figure 6B:
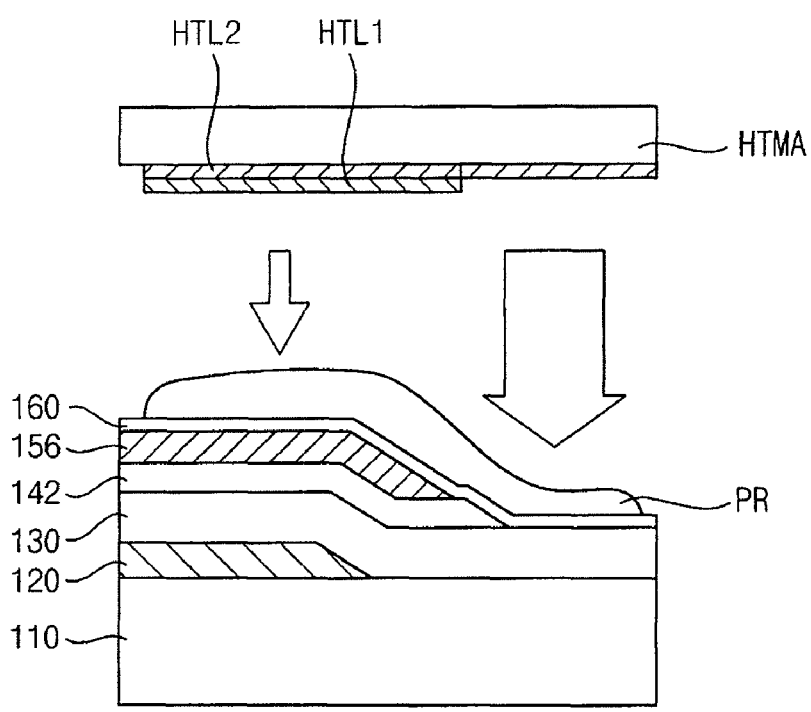
FIG. 6B is a cross-sectional view illustrating an inclined portion of a TFT of an array substrate manufactured through a halftone mask according to an exemplary embodiment of the present invention.

FIG. 6A is a cross-sectional view illustrating an inclined portion of a TFT of an array substrate manufactured through a conventional multi-slit mask. FIG. 6B is a cross-sectional view illustrating an inclined portion of a TFT of an array substrate manufactured through a halftone mask according to an exemplary embodiment of the present invention.

Referring to FIG. 6A, a TFT formed in a portion area (e.g., a TFT area) of a transparent substrate 110 has a predetermined height. Here, the TFT may be defined by a gate electrode 120, a gate insulation layer 130, an active layer 142 and a source-drain electrode 156 that are sequentially formed thereon. The gate insulation layer 130 is formed on the gate electrode 120 and the remaining area of the gate electrode 120 by a predetermined thickness, and the active layer 142 and the source-drain electrode 156 are patterned to cover the gate electrode 120. Moreover, a passivation film 160 and a photoresist pattern PR are formed to cover the TFT and the gate insulation layer 130.

However, the TFT may have a predetermined height on the transparent substrate 110, so that a predetermined stepped difference is at an inclined portion of the TFT. Thus, even though a multi-slit mask SLMA is used to partially remove the photoresist pattern PR, so that uniform light is applied to the photoresist film PR so that a relatively thicker photoresist pattern remains at the inclined portion.

Accordingly, even though the multi-mask SLMA is used, the thickness of the photoresist pattern PR remaining at an inclined surface corresponding to a stepped portion is relatively thicker so that an error may be generated during the following process. To provide a uniform a thickness for the remaining photoresist pattern PR, a technology has been developed, which varies a partial exposing energy by using a mask having a slit design of a metal portion and a slit design of a non-metal portion which are differently adapted thereto.

However, when a different halftone mask according to exemplary embodiments of the present invention is used, the thickness of the remaining photoresist pattern PR may be uniform, which remains at an inclined surface corresponding to the stepped portion.

Referring to FIG. 6B, a halftone mask HTMA having a first halftone layer HTL1 and a second halftone layer HTL2 is disposed on the result product illustrated in FIG. 6A. Here, an inclined area of the TFT corresponds to the second halftone layer HTL2. The remaining area of the TFT corresponds to the first halftone layer HTL1 and the second halftone layer HTL2 that are overlapped with each other. Thus, a relatively large amount of light is provided to the inclined area of the TFT, and a relatively small amount of light is provided to the remaining area of the TFT, so that a photoresist pattern of a substantially uniform thickness may remain.

Alternatively, a halftone mask HTMA may be adapted, which has a halftone layer having a relatively low light transmittance in correspondence with a metal portion and a halftone layer having a relatively high light transmittance in correspondence with a non-metal portion.

As described above, an array substrate is manufactured by using a halftone mask, so that a photoresist pattern of a uniform thickness may remain at an inclined surface in comparison with a process using a multi-slit mask. As a result, a protruding portion may be prevented from being generated by a non-uniform of a photoresist pattern at the inclined surface.

To prevent a static electricity from being infiltrated into a display area of an array substrate, a static electricity preventing circuit may be formed in a peripheral area of the display area, which will be described as following FIG. 7.

Figure 7:
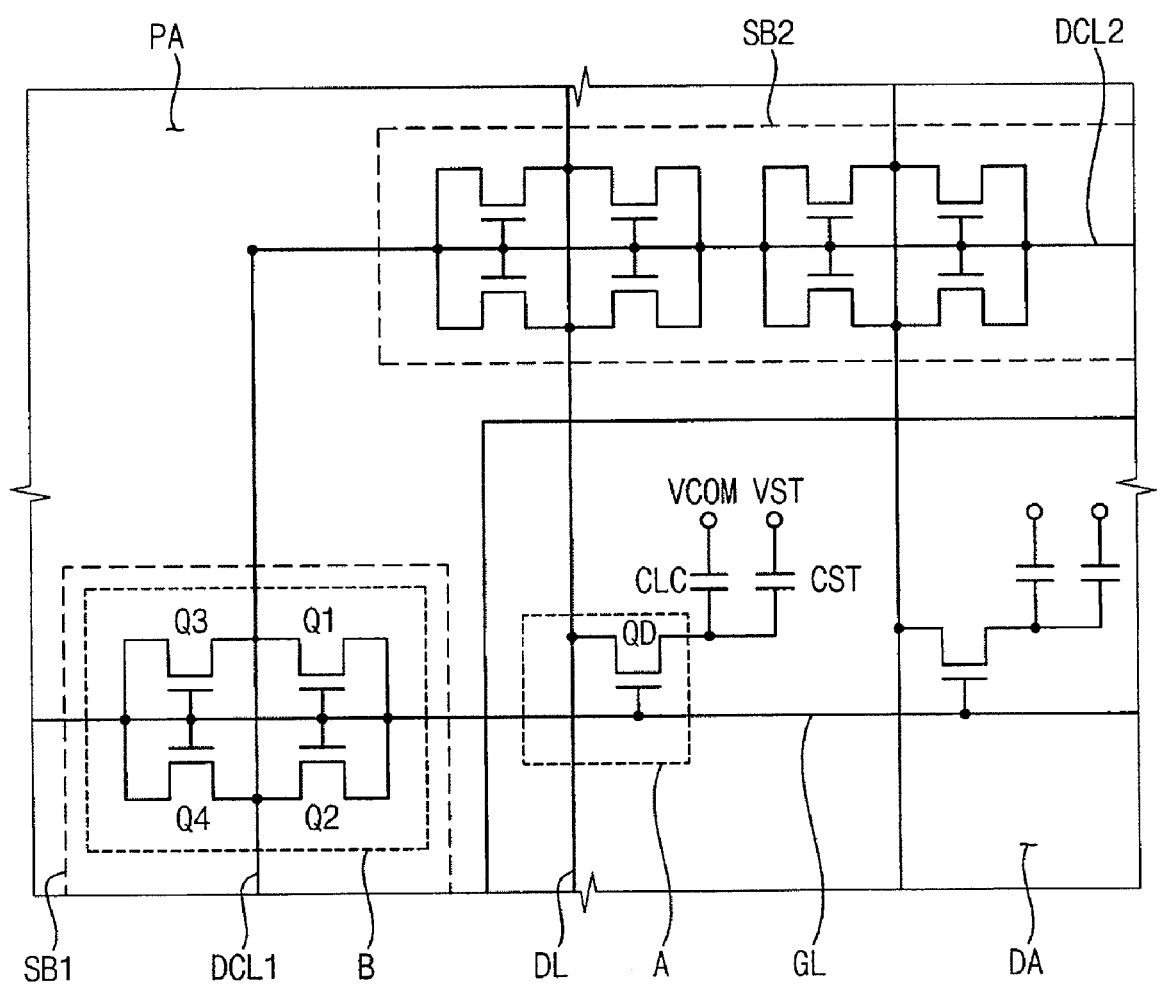
FIG. 7 is an equivalent circuit diagram of a liquid crystal display (LCD) panel having a static electricity preventing function.

FIG. 7 is an equivalent circuit diagram of an LCD panel having a static electricity preventing function.

Referring to FIG. 7, an LCD panel having a static electricity preventing function includes a display area DA and a peripheral area PA surrounding the display area DA.

A gate line GL, a data line DL, a display TFT QD, a liquid crystal capacitor (CLC) and a storage capacitor (CST). The display TFT QD is electrically connected to the gate line GL and the data line DL. The liquid crystal capacitor CLC and the storage capacitor CST are electrically connected to a drain electrode of the display TFT QD, respectively.

A first static electricity preventing portion SB1 and a second static electricity preventing portion SB2 are formed in the peripheral area PA. The first static electricity preventing portion SB1 is electrically connected to the data line DL of the display TFT QD to prevent a static electricity from being provided to the display area DA. The second static electricity preventing portion SB2 is electrically connected to the gate line GL of the display TFT QD to prevent a static electricity from being provided to the display area DA.

A static electricity preventing circuit is formed in the first and second static electricity preventing portions SB1 and SB2, respectively. For example, four static electricity preventing circuits are formed at an end terminal of one data line DL, and four static electricity preventing circuits are formed at an end terminal of one gate line GL. Each of the static electricity preventing circuits may include a first TFT Q1, a second TFT Q2, a third TFT Q3 and a fourth TFT Q4. Each of the first, second, third, fourth TFTs Q1, Q2, Q3 and Q4 are diode-connected.

The TFTs for preventing a static electricity, which are disclosed in the first static electricity preventing portion SB1, may be electrically connected to a horizontal discharging line DCL1 formed at the peripheral area PA in parallel with the gate line GL.

The TFTs for preventing a static electricity, which are disclosed in the second static electricity preventing portion SB2, may be electrically connected to a vertical discharging line DCL2 formed at the peripheral area PA in parallel with the gate line GL.

The first to fourth TFTs Q1, Q2, Q3 and Q4 for preventing a static electricity are formed by the same process as the display TFT QD.

Figure 8A:
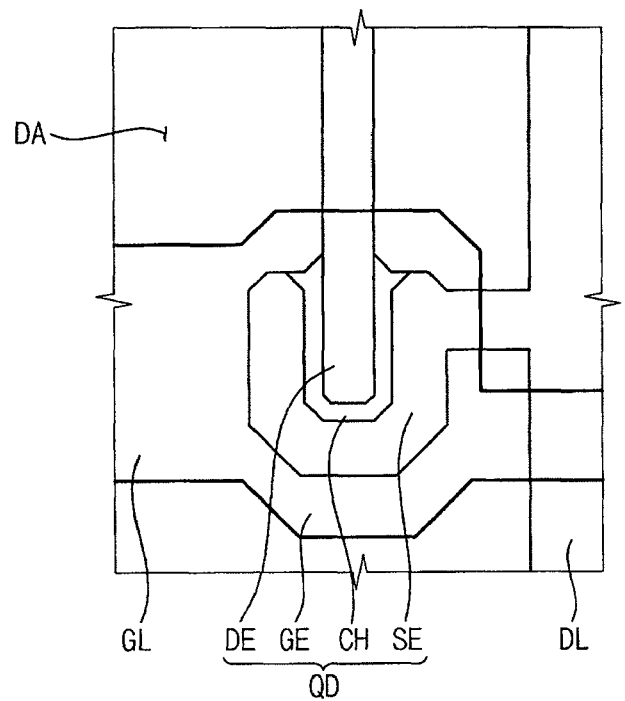
FIG. 8A is a layout diagram illustrating a TFT for displaying as shown in FIG. 7.
Figure 8B:
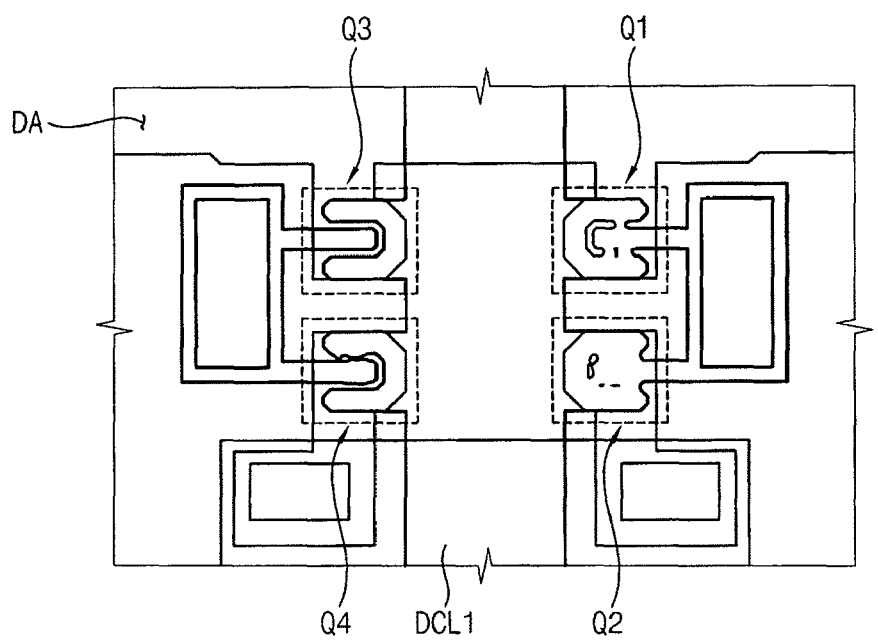
FIG. 8B is a layout diagram illustrating a TFT for preventing a static electricity as shown in FIG. 7.

FIG. 8A is a layout diagram illustrating a TFT for displaying as shown in FIG. 7. FIG. 8B is a layout diagram illustrating a TFT for preventing a static electricity as shown in FIG. 7.

When an array substrate is manufactured through a four-mask process, a channel layer CH between the source electrode SE and the drain electrode DE is normally formed in an active area of the display TFT QD (see FIG. 8A). In FIG. 8A, 'GL' represents a gate line, and 'DL' represents a data line. Moreover, the display TFT QD is defined by a gate electrode GE, a channel layer CH formed on the gate electrode GE, and a source electrode SE and a drain electrode that are formed on the channel layer CH to be spaced apart from each other.

A channel short error may be generated in a static diode area of the TFT for preventing a static electricity. For example, In FIG. 8B, a channel layer of a third TFT Q3 is normally formed; however, a short error was generated in each of channel layers of the first, the second and the fourth TFTs Q1, Q2 and Q4. To prevent a short error of a static diode from being generated in a general slit mask, a slit interval corresponding to the static diode is wider than the active area.

However, when a halftone mask according to exemplary embodiments of the present invention is used, light transmittance is controlled by halftone layers formed to transmit the different light amount from each other so that an exposure amount of light may be controlled. In a conventional mask, it is difficult to control a thickness of a photoresist pattern corresponding to the static diode area and a thickness of a photoresist pattern corresponding to the active area are different from each other. Thus, a short error may be generated by a structure of films or layers formed under the photoresist pattern, a distribution such as a coating process, an exposing process, a developing process and so on.

However, when a halftone mask is used, a short error may be prevented, which is generated by a structure of films or layers formed under the photoresist pattern, a distribution such as a coating process, an exposing process, a developing process and so on. That is, a halftone mask, which includes a low halftone layer having a relatively low light transmittance in correspondence with an active area and a high halftone layer having a relatively high light transmittance in correspondence with a static diode, is disposed on a photoresist pattern, so that a thickness of a remaining photoresist pattern (rTPR) in correspondence with the static diode area may be decreased. Therefore, a short error may be prevented from being generated.

Exemplary Embodiment 2—Method of Manufacturing a Halftone Mask

FIGS. 9A to 9F are cross-sectional views illustrating a method of manufacturing a halftone mask according to Exemplary Embodiment 2 of the present invention.

Figure 9A:
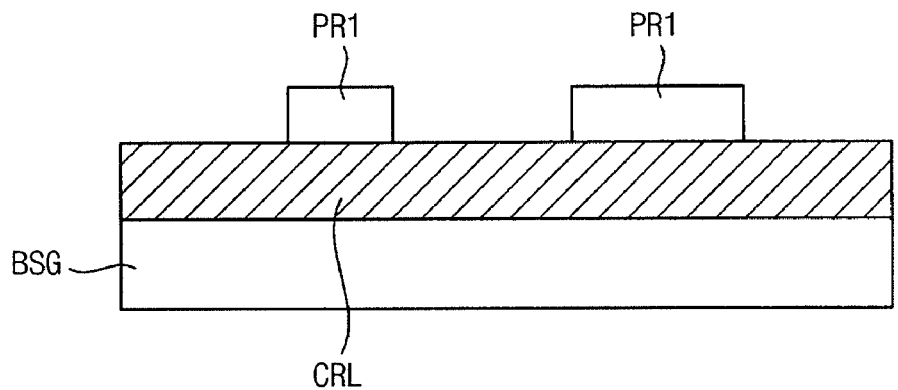
FIGS. 9A to 9F are cross-sectional views illustrating a method of manufacturing a halftone mask according to the exemplary embodiment of the present invention of FIG. 4.

Referring to FIG. 9A, a plurality of first photoresist patterns PR1 is formed on a portion of chromium layer deposited on a whole surface of a transparent substrate BSG.

Figure 9B:
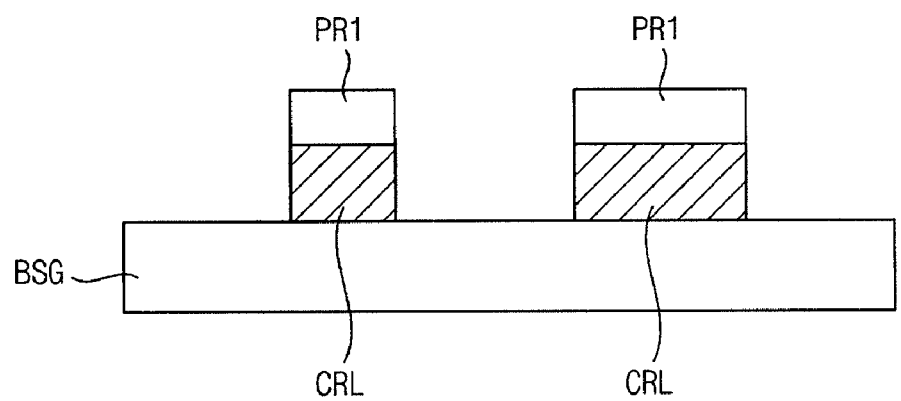

Referring to FIG. 9B, the chromium layer CRL formed in the remaining area except the first photoresist patterns PR1 through an etching process including an exposing process, a developing process and a cleaning process by using the first photoresist patterns PR1 as a mask.

Figure 9C:
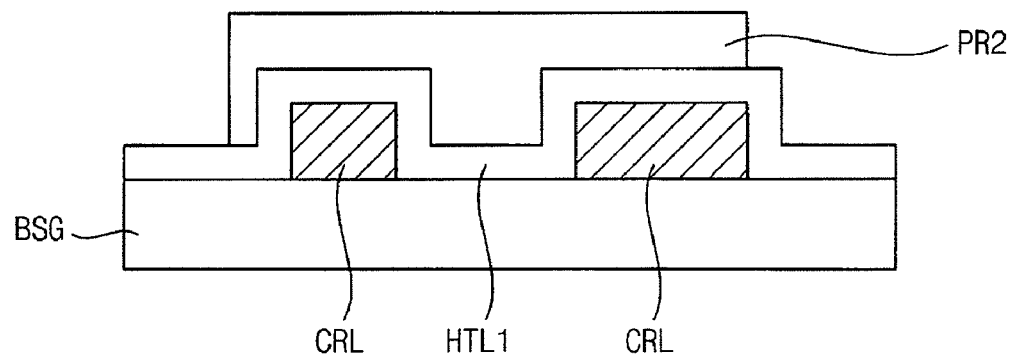

Referring to FIG. 9C, a first halftone layer HTL1 is formed on a whole surface of the resulting product illustrated in FIG. 9B, and then a second photoresist pattern PR2 is formed in a portion area of the resulting product. In this exemplary embodiment, a light-blocking layer that blocks light incident into a halftone mask may include chromium (Cr). Thus, the first halftone layer HTL1 may include a material not having an etching selectivity with chromium (Cr) such as, for example, chromium oxide (CrOx).

Figure 9D:
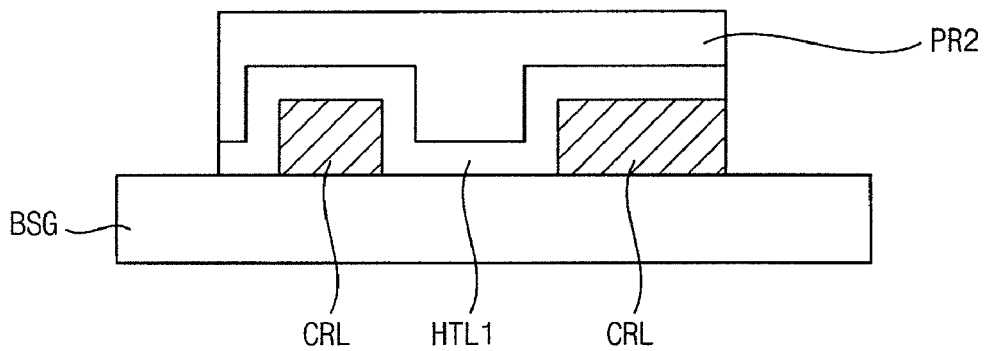

Referring to FIG. 9D, the first halftone layer HTL1 formed in the remaining area except the second photoresist patterns PR2 through an etching process including an exposing process, a develop process and a cleaning process by using the second photoresist pattern PR2 as a mask.

Figure 9E:
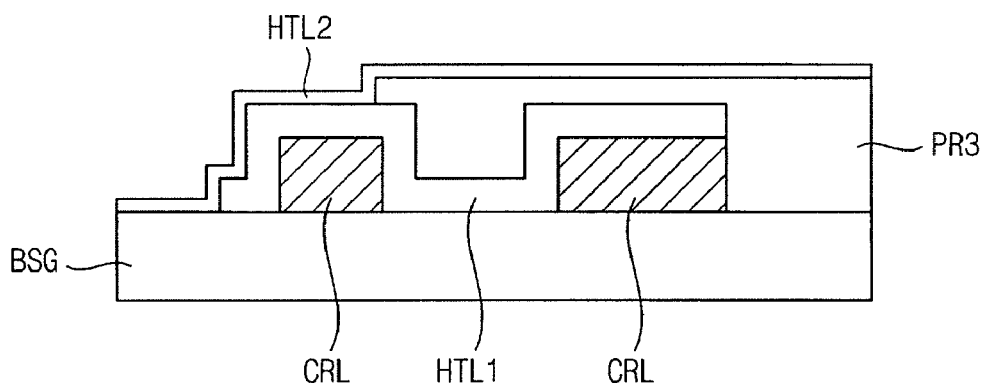

Referring to FIG. 9E, the second photoresist pattern PR2 is removed, and then a third photoresist film PR3 is formed in a portion area to deposit a second halftone layer HTL2 on the whole surface of the remaining second photoresist pattern PR2 and the third photoresist film PR3. A material of the second halftone layer HTL2 may be the same as that of the first halftone layer HTL1.

Figure 9F:
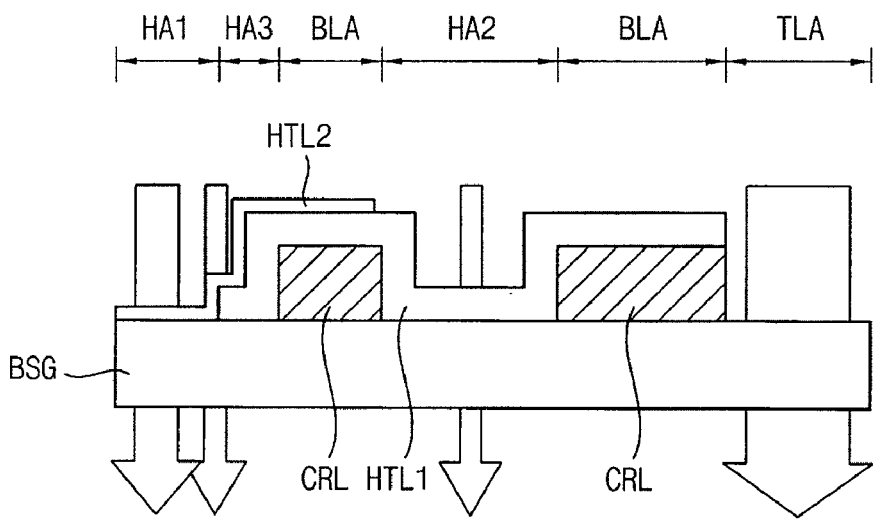

Referring to FIG. 9F, to remove the second halftone layer HTL2 formed on a portion area, the third photoresist pattern PR3 is removed through a lift-off method, so that a halftone mask according to Exemplary Embodiment 2 of the present invention may be completed. In FIG. 9F, the thickness of an arrow represents an amount of light being transmitted through the halftone mask.

The halftone mask according to Exemplary Embodiment 2 of the present invention may include a whole opening area, a covered area by the second halftone layer HTL2, a covered area by the first and second halftone layers HTL1 and HTL2, and a whole covered area by the chromium layer CRL. Thus, the whole opening area may define a light-transmitting area TLA, the covered area by the second halftone layer HTL2 may define a first halftone area HA1 that transmits a relatively large amount of light, and the covered area by the first and second halftone layers HTL1 and HTL2 may define a second halftone area HA2 that transmits a relatively small amount of light. The whole covered area by the chromium layer CRL may define a light-blocking area BLA.

Exemplary Embodiment 3—Method of Manufacturing a Halftone Mask

FIGS. 10A to 10F are cross-sectional views illustrating a method of manufacturing a halftone mask according to Exemplary Embodiment 3 of the present invention.

Figure 10A:
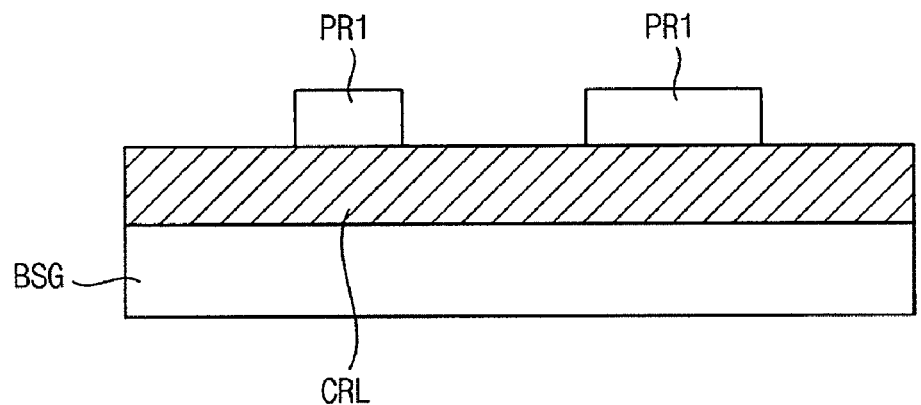
FIGS. 10A to 10F are cross-sectional views illustrating a method of manufacturing a halftone mask according to an exemplary embodiment of the present invention.

Referring to FIG. 10A, a plurality of first photoresist patterns PR1 is formed on a chromium layer CRL deposited on a whole surface of a transparent substrate BSG.

Figure 10B:
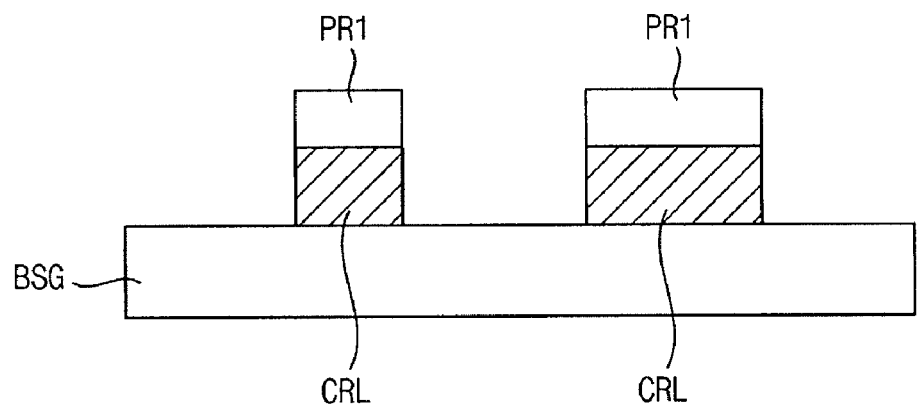

Referring to FIG. 10B, the chromium layer CRL is removed, which is formed on a remaining area except the first photoresist patterns PR1, through an etching process including an exposing process, a developing process and a cleaning process by using the first photoresist patterns PR1 as a mask.

Figure 10C:
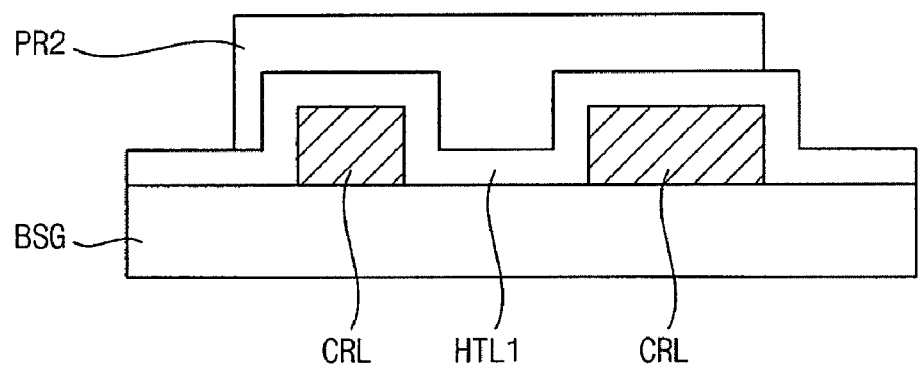

Referring to FIG. 10C, a first halftone layer HTL1 is formed on a whole surface of the resulting product illustrated in FIG. 10B, and then a second photoresist pattern PR2 is formed a portion area of the resulting product. The second photoresist layer PR2 may be formed to cover at least two chromium layers CRL. For example, a first edge of the second photoresist pattern PR2 may be matched with an edge of one chromium layer CRL, and a second edge of the second photoresist layer PR2 may be matched with another chromium layer CRL. In this exemplary embodiment, a light-blocking layer that blocks light incident into a halftone mask may include, for example, chromium (Cr). Thus, the first halftone layer HTL1 may include a material not having an etching selectivity with chromium (Cr) such as, for example, chromium oxide (CrOx).

Figure 10D:
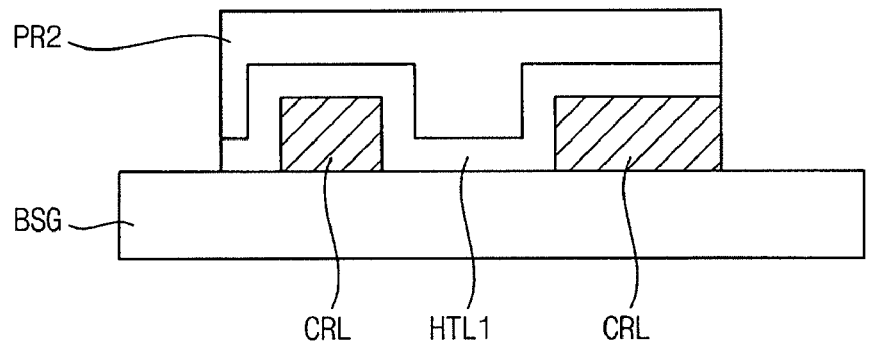

Referring to FIG. 10D, the first halftone layer HT1 is removed, which is formed on a remaining area except the second photoresist pattern PR2, through an etching process including, for example, an exposing process, a develop process and a cleaning process by using the second photoresist pattern PR2 as a mask.

Figure 10E:
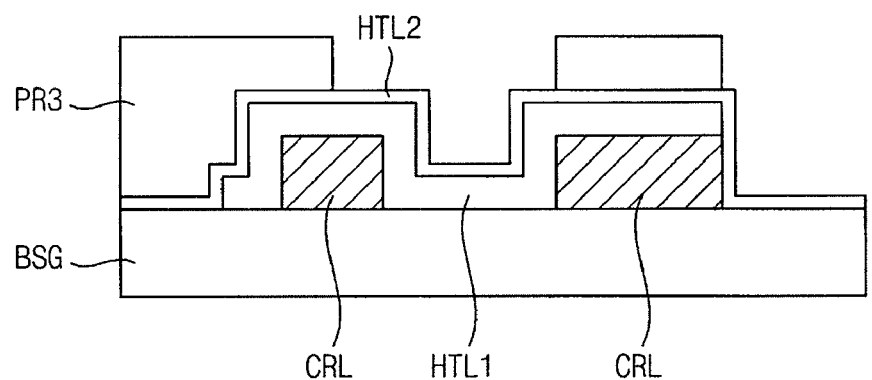

Referring to FIG. 10E, a second halftone layer HTL2 is deposited on a whole surface of the resulting product illustrated in FIG. 10D, and then a third photoresist patterns PR3 is formed in a portion area of the deposited second halftone layer HTL2. One of the third photoresist patterns PR2 is formed in correspondence with one of chromium layer, and another of the third photoresist patterns PR2 is formed to cover another portion of the chromium layer and a portion area where the chromium layer is not formed. In this exemplary embodiment, the second halftone layer HTL2 may include a material having an etching selectivity with chromium (Cr) such as, for example, molybdenum silicon (MoSi).

Figure 10F:
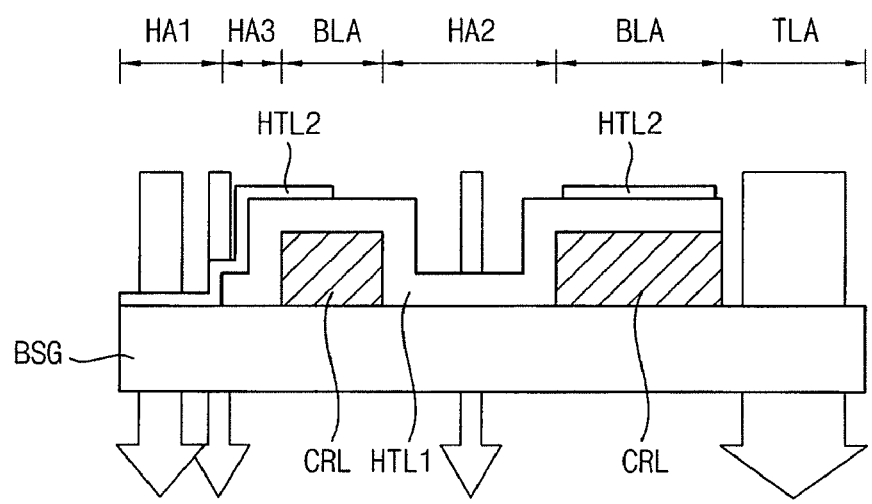

Referring to FIG. 10F, the second halftone layer HTL2 is removed through, for example, an etching process including an exposing process, a develop process and a cleaning process by using a mask as the third photoresist patterns PR3, and then the third photoresist pattern PR3 is removed through a lift-off method, so that a halftone mask according to Exemplary Embodiment 3 of the present invention may be completed. In FIG. 10F, the thickness of an arrow represents an amount of light being transmitted through the halftone mask.

The halftone mask according to Exemplary Embodiment 3 of the present invention may include a whole opening area, a covered area by the second halftone layer HTL2, a covered area by the first halftone layer HTL1, a covered area by the first and second halftone layers HTL1 and HTL2, and a whole covered area by the chromium layer CRL. Thus, the whole opening area may define a light-transmitting area TLA, the covered area by the second halftone layer HTL2 may define a first halftone area HA1 that transmits a relatively large amount of light, and the covered area by the first halftone layer HTL1 may define a second halftone area HA2 that transmits a medium amount of light. The covered area by the first and second halftone layers HTL1 and HTL2 may define a third halftone area HA3 that transmits a relatively small amount of light, and the whole covered area by the chromium layer CRL may define a light-blocking area BLA.

Exemplary Embodiment 4—Method of Manufacturing a Halftone Mask

FIGS. 11A to 11F are cross-sectional views illustrating a method of manufacturing a halftone mask according to Exemplary Embodiment 4 of the present invention.

Figure 11A:
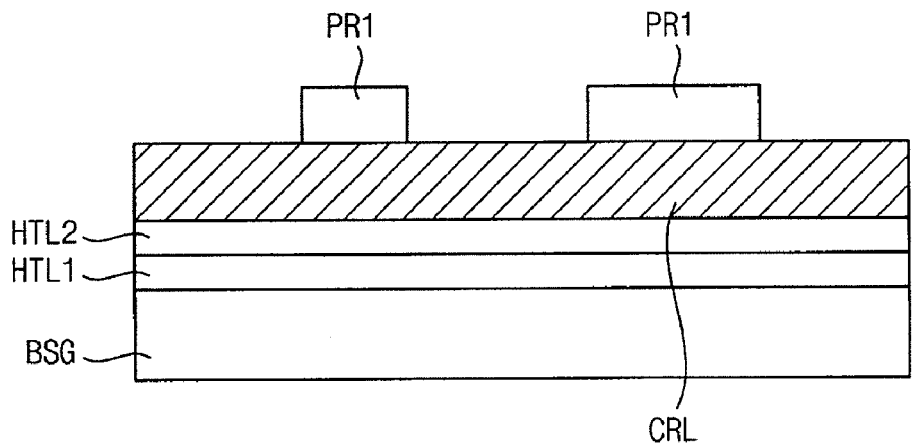
FIGS. 11A to 11F are cross-sectional views illustrating a method of manufacturing a halftone mask according to an exemplary embodiment of the present invention.

Referring to FIG. 11A, a plurality of first photoresist patterns PR1 is formed on a portion area over a first halftone layer HTL1, a second halftone layer HTL2 and a chromium layer CRL that are sequentially deposited on a whole surface of a transparent substrate BSG. In this Exemplary Embodiment 4, the first halftone layer HTL1 may include a material not having an etching selectivity with chromium (Cr) such as, for example, chromium oxide (CrOx), and the second halftone layer HTL2 may include a material having an etching selectivity with chromium (Cr) such as, for example, molybdenum silicon (MoSi).

Figure 11B:
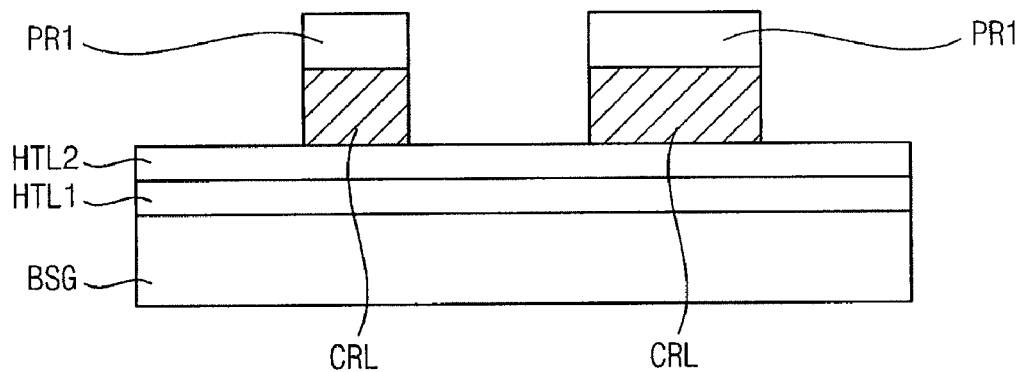

Referring to FIG. 11B, the chromium layer CRL formed in the remaining area except the first photoresist patterns PR1 through, for example, an etching process including an exposing process, a develop process and a cleaning process by using the first photoresist patterns PR1 as a mask.

Figure 11C:
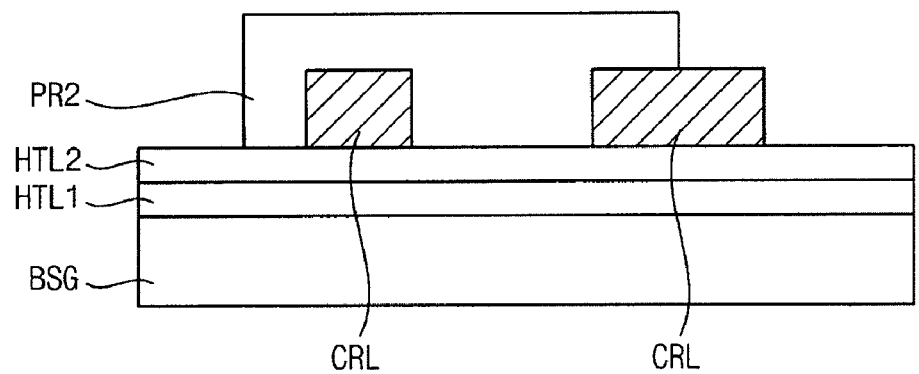

Referring to FIG. 11C, a second photoresist pattern PR2 is formed in a portion area of the resulting product illustrated in FIG. 11B. For example, the second photoresist pattern PR2 is formed to cover one chromium layer and a portion of another chromium layer adjacent to the one chromium layer.

Figure 11D:
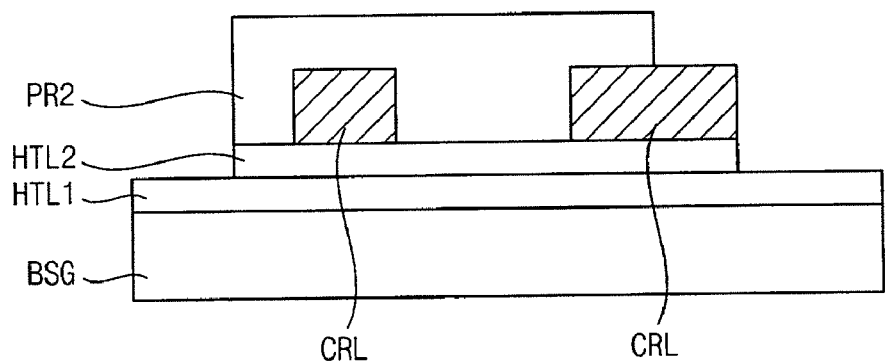

Referring to FIG. 11D, the chromium layer CRL is removed by using the second photoresist pattern PR2 as a mask through an etching process. Here, when the chromium layer CRL is etched, the second halftone layer HTL2 may perform a role of a protecting layer of the first halftone layer HTL1.

Figure 11E:
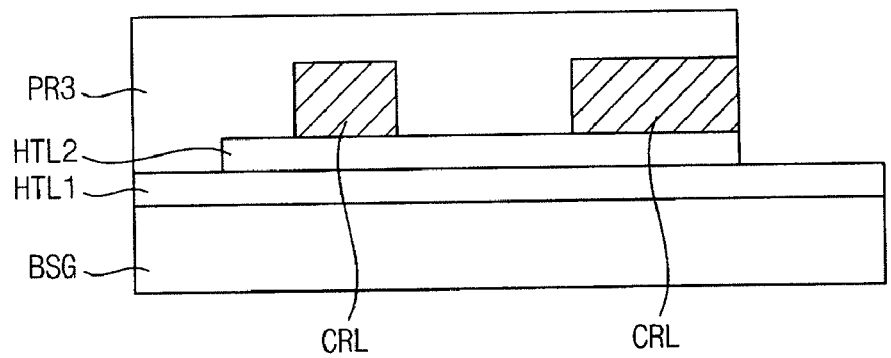

Referring to FIG. 11E, a third photoresist pattern PR3 is formed on the resulting product illustrated in FIG. 11D, and then the first halftone layer HTL1 is removed by using the third photoresist layer PR3 as a mask.

Figure 11F:
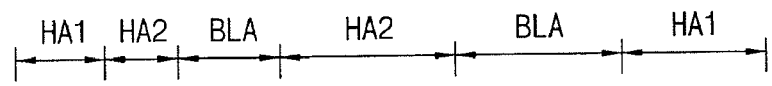
Figure 11F:
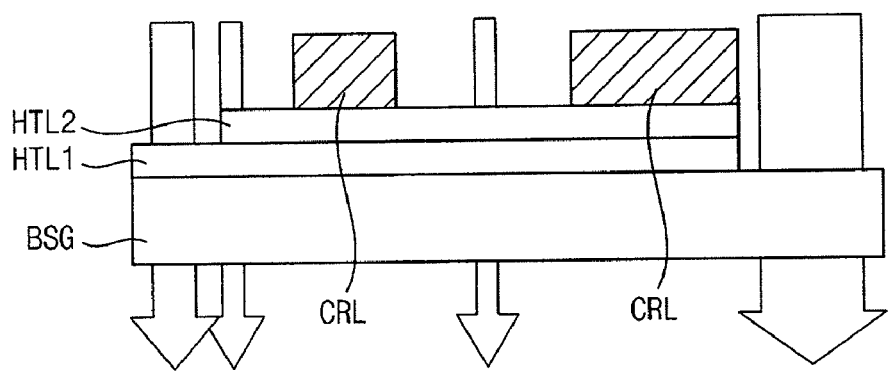

Referring to FIG. 11F, the third photoresist film PR3 is removed to complete a halftone mask according to Exemplary Embodiment 4 of the present invention. In FIG. 11F, the thickness of an arrow represents an amount of light being transmitted through the halftone mask.

The halftone mask according to Exemplary Embodiment 4 of the present invention may include a whole opening area, a covered area by the first halftone layer HTL1, a covered area by the first and second halftone layers HTL1 and HTL2, and a whole covered area by the chromium layer CRL. Thus, the whole opening area may define a light-transmitting area TLA, the covered area by the first halftone layer HTL1 may define a first halftone area HA1 that transmits a relatively large amount of light, and the covered area by the first and second halftone layers HTL1 and HTL2 may define a second halftone area HA2 that transmits a relatively small amount of light. The whole covered area by the chromium layer CRL may define a light-blocking area BLA.

Exemplary Embodiment 5—Method of Manufacturing a Halftone Mask

FIGS. 12A to 12F are cross-sectional views illustrating a method of manufacturing a halftone mask according to Exemplary Embodiment 5 of the present invention.

Figure 12A:
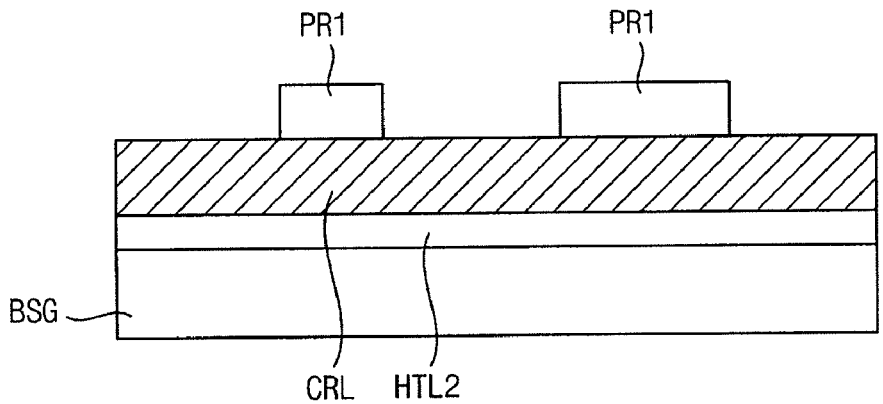
FIGS. 12A to 12F are cross-sectional views illustrating a method of manufacturing a halftone mask according to an exemplary embodiment of the present invention.

Referring to FIG. 12A, a plurality of first photoresist patterns PR1 are formed on a second halftone layer HTL2 and a chromium layer CRL that are sequentially deposited on a transparent substrate BSG. In this exemplary embodiment, the second halftone layer HTL2 may include a material having an etching selectivity with chromium (Cr) such as, for example, molybdenum silicon (MoSi).

Figure 12B:
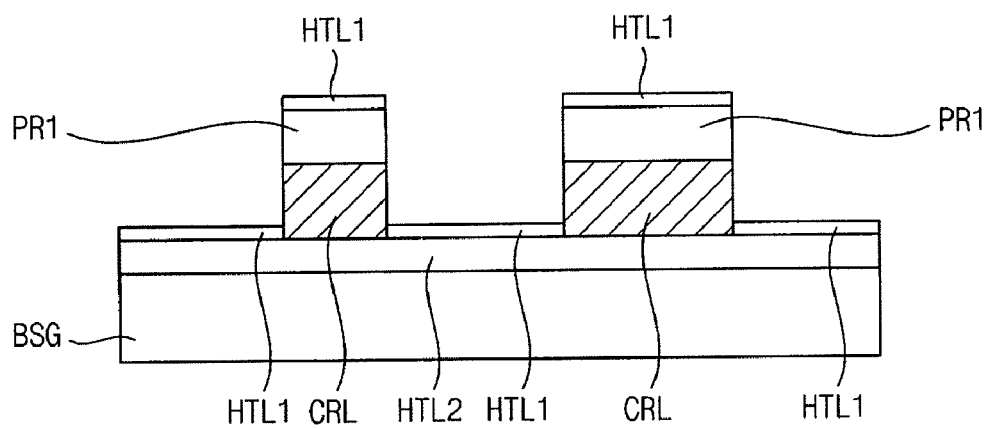

Referring to FIG. 12B, a first halftone layer HTL1 is deposited on a whole surface of the resulting product of FIG. 12A.

Figure 12C:
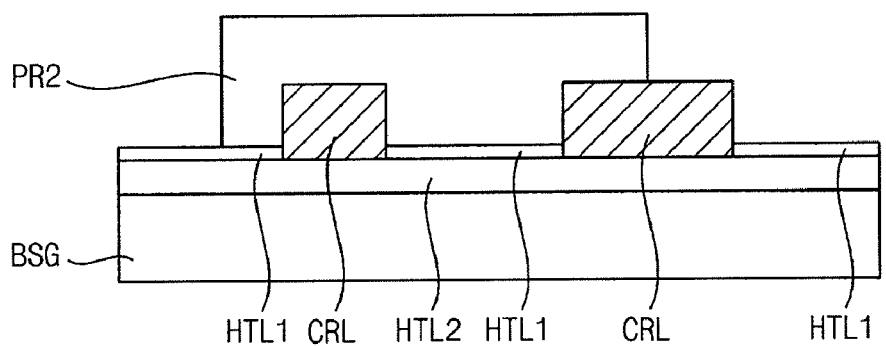

Referring to FIG. 12C, a second photoresist pattern PR2 is formed on a portion area of the resulting product of FIG. 12B.

Figure 12D:
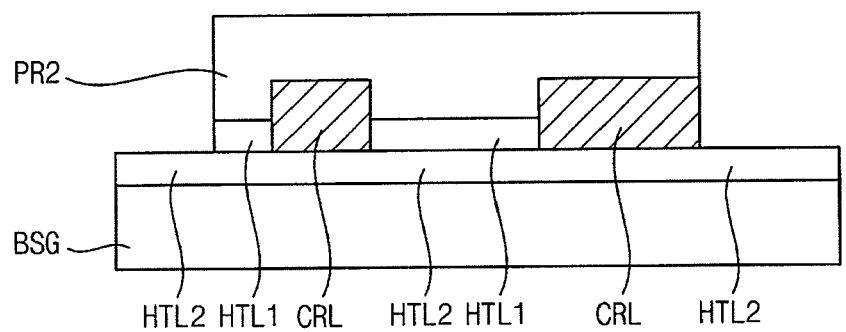

Referring to FIG. 12D, the first halftone layer HTL1 is removed using a mask as the second photoresist pattern PR2.

Figure 12E:
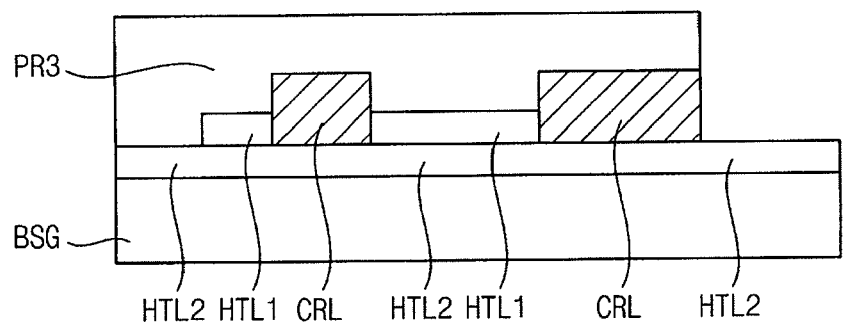

Referring to FIG. 12E, the second photoresist pattern PR2 formed on a portion area is removed, and then a third photoresist pattern PR3 is formed on the portion area.

Figure 12F:
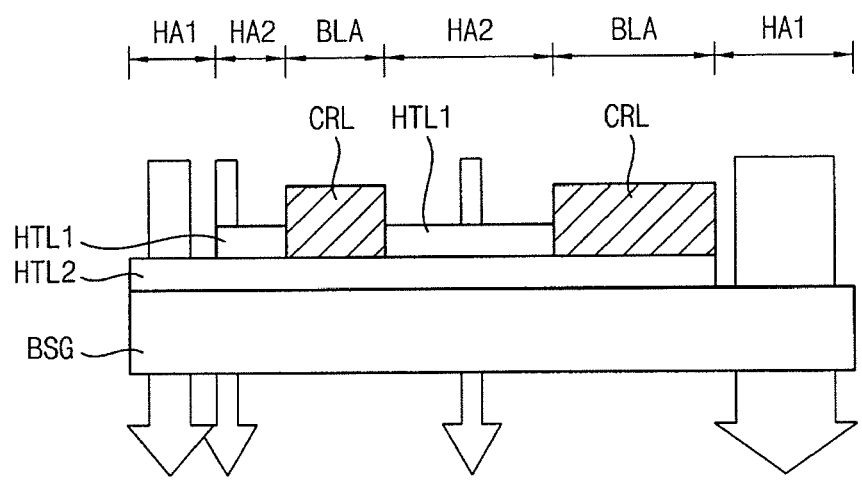

Referring to FIG. 12F, the second halftone layer HTL2 is removed using a mask as the third photoresist pattern PR3, and then the third photoresist pattern PR3 is removed to complete a halftone mask according to Embodiment 4 of the present invention. In FIG. 12F, the thickness of an arrow represents an amount of light being transmitted through the halftone mask.

The halftone mask according to Exemplary Embodiment 5 of the present invention may include a whole opening area, a covered area by the second halftone layer HTL2, a covered area by the first and second halftone layers HTL1 and HTL2, and a whole covered area by the chromium layer CRL. Thus, the whole opening area may define a light-transmitting area TLA, the covered area by the second halftone layer HTL2 may define a first halftone area HA1 that transmits a relatively large amount of light, and the covered area by the first and second halftone layers HTL1 and HTL2 may define a second halftone area HA2 that transmits a relatively small amount of light. The whole covered area by the chromium layer CRL may define a light-blocking area BLA.

Exemplary Embodiment 6—Method of Manufacturing a Halftone Mask

FIGS. 13A to 13D are cross-sectional views illustrating a method of manufacturing a halftone mask according to Exemplary Embodiment 6 of the present invention.

Figure 13A:
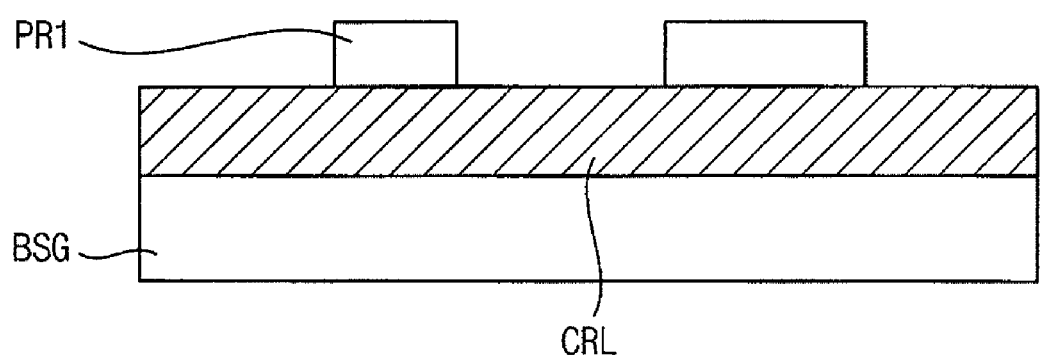
FIGS. 13A to 13D are cross-sectional views illustrating a method of manufacturing a halftone mask according to an exemplary embodiment of the present invention.

Referring to FIG. 13A, a first photoresist pattern PR1 is formed on a chromium layer CRL deposited on a transparent substrate BSG, and a portion of the chromium layer CRL is removed by using the first photoresist film PR1 as a mask.

Figure 13B:
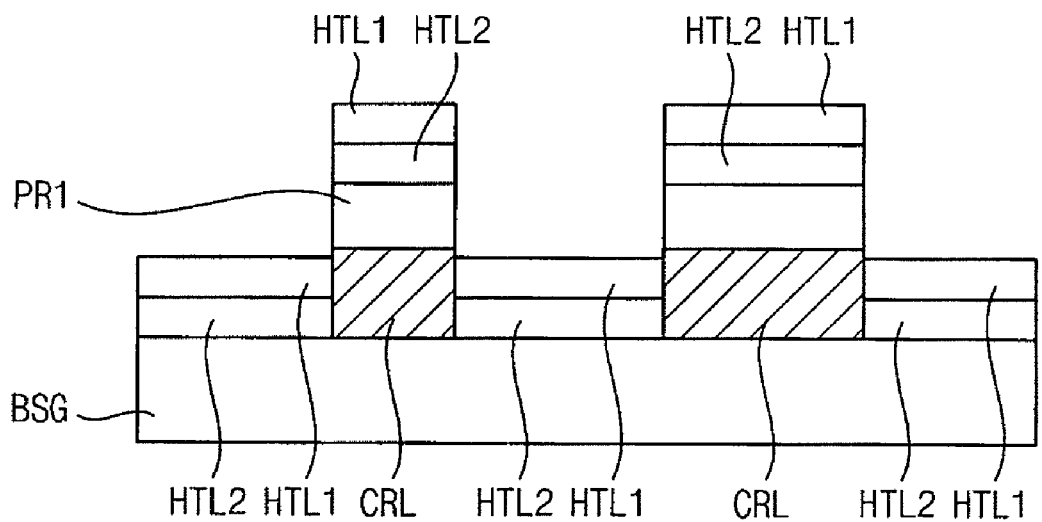

Referring to FIG. 13B, a second halftone layer HTL2 and a first halftone layer HTL1 are sequentially deposited on the resulting product of FIG. 13A. In this exemplary embodiment, the first halftone layer HTL1 may include a material not having an etching selectivity with chromium (Cr) such as, for example, chromium oxide (CrOx), and the second halftone layer HTL2 may include a material having an etching selectivity with chromium (Cr) such as, for example, molybdenum silicon (MoSi).

Figure 13C:
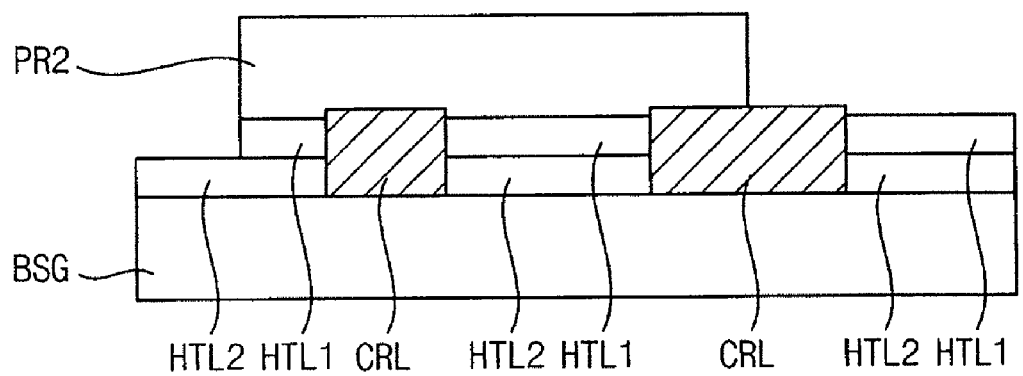

Referring to FIG. 13C, the first photoresist pattern PR1 is removed from the resulting product of FIG. 13B through a lift-off method to form a second photoresist pattern PR2 in a portion area.

Figure 13D:
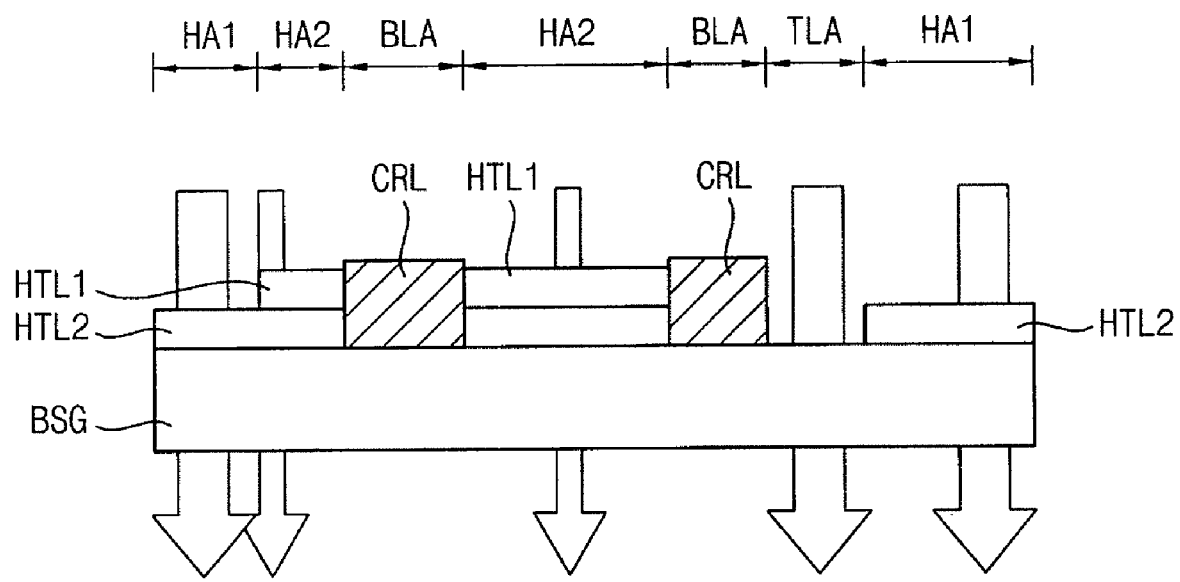

Referring to FIG. 13D, the first halftone layer HTL1 and the chromium layer CRL are removed using a mask as the second photoresist pattern PR2, and then the second photoresist pattern PR2 is removed to complete a halftone mask according to Exemplary Embodiment 6 of the present invention. In FIG. 13D, the thickness of an arrow represents an amount of light being transmitted through the halftone mask.

The halftone mask according to Exemplary Embodiment 6 of the present invention may include a whole opening area, a covered area by the second halftone layer HTL2, a covered area by the first and second halftone layers HTL1 and HTL2, and a whole covered area by the chromium layer CRL. Thus, the whole opening area may define a light-transmitting area TLA, the covered area by the second halftone layer HTL2 may define a first halftone area HA1 that transmits a relatively large amount of light, and the covered area by the first and second halftone layers HTL1 and HTL2 may define a second halftone area HA2 that transmits a relatively small amount of light. The whole covered area by the chromium layer CRL may define a light-blocking area BLA.

As described above, in a process partially removing a photoresist pattern formed in correspondence with an inclined surface during a manufacturing of an array substrate, a differential halftone mask is used, so that a thickness of a remaining photoresist pattern (rTPR) in a stepped portion corresponding to the inclined surface may be uniformed.

Therefore, in comparison with a process using a multi-slit mask, a photoresist pattern of a uniform thickness may remain at an inclined surface or a stepped portion. As a result, a protruding portion may be prevented from being generated by a non-uniform of a photoresist pattern at the inclined surface or the stepped portion.

Moreover, when an array substrate having a static electricity preventing function is manufactured, a channel short error may be prevented from being generated in a diode area of a TFT for preventing static electricity, which is formed in a peripheral area of the array substrate. That is, a halftone mask, which includes a low halftone layer having a relatively low light transmittance in correspondence with an active area and a high halftone layer having a relatively high light transmittance in correspondence with a static diode, is disposed on a photoresist pattern, so that a thickness of a remaining photoresist pattern (rTPR) in correspondence with the static diode area may be decreased. Therefore, a short error may be prevented from being generated.

Consequently, according to exemplary embodiments of the present invention, a channel short error may be prevented from being generated in a diode area of a TFT for thereby preventing a static electric formed at a peripheral area of an array substrate.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a halftone mask, the method comprising:
    forming a first photoresist pattern on a second halftone layer and a first halftone layer that are deposited on a transparent substrate in sequence;
    removing exposed portions of the first halftone layer and the second halftone layer by using the first photoresist pattern as a mask;
    depositing a light-blocking layer on the whole surface of the transparent substrate;
    removing the first photoresist pattern with the light-blocking layer formed on the first photoresist pattern and forming a second photoresist pattern on a portion area of the transparent substrate;
    removing exposed portions of the light-blocking layer and the first halftone layer by using the second photoresist pattern as a mask; and
    removing the second photoresist pattern.

2. The method of claim 1, wherein at least one of the first and second halftone layers includes a material not having an etching selectivity with respect to the light-blocking layer, and the remaining halftone layer includes a material having an etching selectivity with respect to the light-blocking layer.

3. The method of claim 2, wherein the light-blocking layer comprises chromium (Cr), the first halftone layer comprises chromium oxide (CrOx), and the second halftone layer comprises molybdenum-silicon (MoSi).

4. A method of manufacturing a halftone mask, the method comprising:
    forming a first photoresist pattern on a light-blocking layer deposited on a transparent substrate;
    removing exposed portions of the light-blocking layer by using the first photoresist pattern as a mask;
    forming a first halftone layer on the whole surface of the transparent substrate and forming a second photoresist pattern on a portion area of the transparent substrate;
    removing exposed portions of the first halftone layer by using the second photoresist pattern as a mask;
    forming a third photoresist pattern on the portion area of the transparent substrate after removing the second photoresist pattern, and depositing a second halftone layer on a whole surface of the transparent substrate; and
    removing the third photoresist pattern with a portion of the second halftone layer on the third photoresist pattern.

5. The method of claim 4, wherein a material of the second halftone layer is substantially identical to that of the first halftone layer.

6. A method of manufacturing a halftone mask, the method comprising:
    forming a first photoresist pattern on a light-blocking layer deposited on a transparent substrate;
    removing exposed portions of the light-blocking layer by using the first photoresist pattern as a mask;
    forming a first halftone layer on the whole surface of the transparent substrate and forming a second photoresist pattern on a portion area of the transparent substrate;
    removing exposed portions of the first halftone layer by using the second photoresist pattern as a mask;
    depositing a second halftone layer on a whole surface of the transparent substrate and forming a third photoresist pattern on the deposited second halftone layer;
    removing the second halftone layer by using the third photoresist pattern as a mask; and
    removing the third photoresist pattern through a lift-off method.

7. The method of claim 6, wherein the first halftone layer includes a material not having an etching selectivity with respect to the light-blocking layer, and
    the second halftone layer includes a material having an etching selectivity with respect to the light-blocking layer.

8. The method of claim 7, wherein the light-blocking layer comprises chromium (Cr), the first halftone layer comprises chromium oxide (CrOx), and the second halftone layer comprises molybdenum silicon (MoSi).

9. A method of manufacturing a halftone mask, the method comprising:
    forming a first photoresist pattern on a first halftone layer, a second halftone layer and a light-blocking layer which are sequentially deposited on a transparent substrate;
    removing exposed portions of the light-blocking layer by using the first photoresist pattern as a mask;
    forming a second photoresist pattern on a portion area of the transparent substrate;
    removing the light-blocking layer by using the second photoresist pattern as a mask;
    forming a third photoresist pattern on the portion area of the transparent substrate after removing the second photoresist pattern and removing the first halftone layer by using the third photoresist pattern as a mask; and
    removing the third photoresist pattern.

10. The method of claim 9, wherein the first halftone layer includes a material not having an etching selectivity with respect to the light-blocking layer, and
    the second halftone layer includes a material having an etching selectivity with respect to the light-blocking layer.

11. The method of claim 10, wherein the light-blocking layer comprises chromium (Cr), the first halftone layer comprises chromium oxide (CrOx), and the second halftone layer comprises molybdenum silicon (MoSi).

12. The method of claim 9, wherein the second halftone layer protects the first halftone layer formed below the second halftone layer in removing the light-blocking layer.

13. A method of manufacturing a halftone mask, the method comprising:
    forming a first photoresist pattern on a second halftone layer and a light-blocking layer which are sequentially deposited on a transparent substrate;
    removing exposed portions of the light-blocking layer and the second halftone layer by using the first photoresist pattern as a mask;
    depositing a first halftone layer on a whole surface of the transparent substrate;
    forming a second photoresist pattern on a portion area of the transparent substrate;
    removing a portion of the first halftone layer by using the second photoresist pattern as a mask;
    removing the second photoresist pattern formed on the portion area of the transparent substrate and forming a third photoresist pattern on the portion area of the transparent substrate in which the second photoresist pattern has been removed;
    removing the second halftone layer by using the third photoresist pattern as a mask; and
    removing the third photoresist pattern.

14. The method of claim 13, wherein the first halftone layer includes a material not having an etching selectivity with respect to the light-blocking layer, and the second halftone layer includes a material having an etching selectivity with respect to the light-blocking layer.

15. The method of claim 14, wherein the light-blocking layer comprises chromium (Cr), the first halftone layer comprises chromium oxide (CrOx), and the second halftone layer comprises molybdenum silicon (MoSi).

16. A method of manufacturing a halftone mask, the method comprising:
   forming a first photoresist pattern on a light-blocking layer deposited on a transparent substrate, and removing a portion of the light-blocking layer by using the first photoresist film as a mask;
   depositing a second halftone layer and a first halftone layer on a whole surface of the transparent substrate, sequentially;
   removing the first photoresist pattern with a portion of the first and second halftone layers formed on the first photoresist pattern and forming a second photoresist pattern on a portion area of the transparent substrate;
   removing the first halftone layer and the light-blocking layer by using the second photoresist pattern as a mask; and
   removing the second photoresist pattern.

17. The method of claim 16, wherein the first halftone layer includes a material not having an etching selectivity with respect to the light-blocking layer, and
   the second halftone layer includes a material having an etching selectivity with respect to the light-blocking layer.

18. The method of claim 17, wherein the light-blocking layer comprises chromium (Cr), the first halftone layer comprises chromium oxide (CrOx), and the second halftone layer comprises molybdenum-silicon (MoSi).

* * * * *